(12) United States Patent
Kim et al.

(10) Patent No.: US 11,848,330 B2
(45) Date of Patent: Dec. 19, 2023

(54) DISPLAY DEVICE

(71) Applicant: Samsung Display Co., Ltd., Yongin-si (KR)

(72) Inventors: June Hwan Kim, Daejeon (KR); Tae Young Kim, Seongnam-si (KR); Jong Woo Park, Seongnam-si (KR); Young Tae Choi, Cheonan-si (KR); Hyun Cheol Hwang, Seoul (KR); Ki Ju Im, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 63 days.

(21) Appl. No.: 16/875,770

(22) Filed: May 15, 2020

(65) Prior Publication Data

US 2021/0104558 A1 Apr. 8, 2021

(30) Foreign Application Priority Data

Oct. 4, 2019 (KR) ........................ 10-2019-0123220

(51) Int. Cl.
*H01L 27/12* (2006.01)
*H01L 29/786* (2006.01)
*H10K 59/121* (2023.01)

(52) U.S. Cl.
CPC ...... *H01L 27/1237* (2013.01); *H01L 27/1218* (2013.01); *H01L 27/1255* (2013.01);
(Continued)

(58) Field of Classification Search
CPC ............. H01L 27/1237; H01L 27/1218; H01L 27/1255; H01L 27/3262; H01L 27/3265; H01L 29/78675; H01L 29/7869
(Continued)

(56) References Cited

U.S. PATENT DOCUMENTS 7,042,055 B2 * 5/2006 Saito ................. H01L 21/28185
438/782
2005/0233558 A1 * 10/2005 Yamamoto ........ H01L 21/28176
438/542
(Continued)

FOREIGN PATENT DOCUMENTS

KR 10-2014-0079093 A 6/2014
KR 10-2016-0002584 A 1/2016
(Continued)

*Primary Examiner* — Ori Nadav
(74) *Attorney, Agent, or Firm* — Lewis Roca Rothgerber Christie LLP

(57) ABSTRACT

A display device is provided. The display device comprises a substrate, a first buffer layer on the substrate, a first semiconductor layer on the first buffer layer and including a first active layer, a first gate insulating layer on the first semiconductor layer and the first buffer layer and covering the first active layer, a first conductive layer on the first gate insulating layer and including a first gate electrode, a second conductive layer on the first conductive layer and including a first source/drain electrode, a first interlayer insulating layer on the first conductive layer, a second semiconductor layer on the first interlayer insulating layer and including a second active layer, a second gate insulating layer on the second semiconductor layer and covering the second active layer, and a third conductive layer on the second gate insulating layer and including a second gate electrode and a second source/drain electrode, wherein the first gate insulating layer and the second gate insulating layer include different insulating materials.

21 Claims, 23 Drawing Sheets

(52) U.S. Cl.
CPC .... *H01L 29/7869* (2013.01); *H01L 29/78675* (2013.01); *H10K 59/1213* (2023.02); *H10K 59/1216* (2023.02)

(58) Field of Classification Search
USPC .......................................................... 257/43
See application file for complete search history.

(56) References Cited

U.S. PATENT DOCUMENTS

| | | | |
|---|---|---|---|
| 2006/0164531 A1* | 7/2006 | Yaung | H01L 27/14609 348/308 |
| 2008/0170008 A1* | 7/2008 | Kim | G09G 3/2003 345/76 |
| 2012/0267621 A1* | 10/2012 | Chen | H01L 29/7869 257/43 |
| 2016/0322453 A1* | 11/2016 | Park | H01L 27/3258 |
| 2018/0083052 A1 | 3/2018 | Zhang | |
| 2018/0240855 A1* | 8/2018 | Lee | H01L 27/1251 |
| 2019/0006521 A1 | 1/2019 | Noh et al. | |
| 2019/0259822 A1* | 8/2019 | Jeon | H01L 27/3262 |
| 2019/0341431 A1* | 11/2019 | Lee | H01L 27/3262 |
| 2020/0209697 A1* | 7/2020 | Choi | G02F 1/13338 |
| 2020/0286927 A1* | 9/2020 | Park | H01L 27/1251 |
| 2021/0328148 A1* | 10/2021 | Dong | C08K 3/36 |

FOREIGN PATENT DOCUMENTS

| | | |
|---|---|---|
| KR | 10-2017-0040861 A | 4/2017 |
| KR | 10-2018-0034210 A | 4/2018 |

* cited by examiner

DISPLAY DEVICE

CROSS-REFERENCE TO RELATED APPLICATION

This application claims priority to and the benefit of Korean Patent Application No. 10-2019-0123220, filed on Oct. 4, 2019 in the Korean Intellectual Property Office, the entire content of which is incorporated herein by reference.

BACKGROUND

1. Field

One or more aspects of embodiments of the present disclosure relate to a display device, and more particularly, to a display device that includes transistors having different gate capacitances.

2. Description of the Related Art

The importance of display devices is increasing along with the development of multimedia. Accordingly, various display devices such as organic light-emitting diode (OLED) display devices, liquid crystal display (LCD) devices, and/or the like are used.

Display devices are devices that display an image and include a display panel, such as an organic light-emitting display panel and/or a liquid crystal display panel. Among these, the display device may include light-emitting elements as a light-emitting display panel. For example, a light-emitting diode (LED) may include an OLED that uses an organic material as a fluorescent material, an inorganic light-emitting diode that uses an inorganic material as a fluorescent material, and/or the like.

Such a display device may include a display panel, a gate driving circuit, a data driving circuit, and a timing controller. The display panel includes data lines, gate lines, and pixels, which are formed at intersections (e.g., crossings) between the data lines and the gate lines. Each of the pixels uses a thin layer transistor as a switching element to receive data voltages from the data line when a gate signal is supplied to the gate line. Each of the pixels emits light with a predetermined (or set) brightness according to the data voltages.

Recently, display devices capable of displaying images at a high resolution of ultra-high definition (UHD) are being released, and display devices capable of displaying images at a high resolution of 8K ultra high definition (8K UHD) are being developed. UHD refers to a 3840×2160 resolution, and 8K UHD refers to a 7680×4320 resolution.

In the case of a high-resolution display device, as the number of pixels increases, a driving current of each of the pixels may decrease, and accordingly, a driving voltage range of a driving transistor of each of the pixels may decrease.

SUMMARY

One or more aspects of embodiments of the present disclosure are directed toward a display device of which a driving transistor and a switching transistor have different gate capacitances, depending on element characteristics thereof.

It should be noted that objects of the present disclosure are not limited to the above-described objects, and other objects of the present disclosure should become apparent to those skilled in the art from the following descriptions.

According to an embodiment, a display device may comprise a substrate, a buffer layer on the substrate, a first semiconductor layer on the buffer layer and including an active layer of a first switching transistor, a first gate insulating layer on the first semiconductor layer, a first gate conductive layer on the first gate insulating layer and including a gate electrode of the first switching transistor, a first protective layer on the first gate conductive layer, a second gate conductive layer on the first protective layer and including a gate electrode of a driving transistor, a first interlayer insulating layer on the second gate conductive layer, a second semiconductor layer on the first interlayer insulating layer and including an active layer of a second switching transistor, a second gate insulating layer on the second semiconductor layer, a third gate conductive layer on the second gate insulating layer and including a gate electrode of the second switching transistor, a third gate insulating layer on the first interlayer insulating layer and a third semiconductor layer on the third gate insulating layer and including an active layer of the driving transistor, wherein a distance between the active layer and the gate electrode of the driving transistor is greater than a distance between the active layer and the gate electrode of the second switching transistor.

The first semiconductor layer may include polysilicon, and the second semiconductor layer and the third semiconductor layer may each include an oxide semiconductor.

The second gate insulating layer may be also between the active layer and the gate electrode of the driving transistor.

The third gate insulating layer may be on the second gate insulating layer.

At least a portion of the third gate insulating layer may cover the gate electrode of the second switching transistor.

The third gate insulating layer may be between the second gate insulating layer and the first interlayer insulating layer.

The active layer of the second switching transistor may be on the third gate insulating layer.

The display device may further comprise an insulating pattern between the active layer and the gate electrode of the driving transistor and between the third gate insulating layer and the first interlayer insulating layer.

The active layer of the driving transistor and the active layer of the second switching transistor may be on the same layer.

The active layer of the driving transistor may be on the second gate insulating layer.

The distance between the active layer and the gate electrode of the second switching transistor may be smaller than a distance between the active layer and the gate electrode of the first switching transistor.

A thickness of the second gate insulating layer may be smaller than a thickness of the first gate insulating layer.

The first gate conductive layer may further include an electrode of a first capacitor on the first gate insulating layer and overlapping the gate electrode of the driving transistor.

The first semiconductor layer may further include a semiconductor pattern disposed on the buffer layer and in a region overlapping the gate electrode of the driving transistor.

According to another embodiment, a display device may comprise a substrate, a driving transistor on the substrate and including a first active layer and a first gate electrode, a first switching transistor on a layer that is different from a layer on which the driving transistor is positioned and including a second active layer and a second gate electrode, a second switching transistor on a layer that is different from the layer on which the first switching transistor is positioned and including a third active layer and a third gate electrode, a first gate insulating layer between the second active layer and the second gate electrode, a second gate insulating layer between the third active layer and the third gate electrode and a third gate insulating layer between the first active layer and the first gate electrode, wherein a first distance which is a distance between the first active layer and the first gate electrode is greater than a second distance between the second active layer and the second gate electrode.

The second distance may be greater than a third distance which is a distance between the third active layer and the third gate electrode.

The first active layer and the third active layer may each include an oxide semiconductor, and the second active layer may include polysilicon.

The first gate electrode, the first active layer, the third gate electrode, and the third active layer may each be at a higher level than the first gate insulating layer.

The first active layer may be above the first gate electrode, and the third gate electrode may be at a higher level than the third active layer.

The second gate insulating layer may be also between the first gate electrode and the first active layer.

The third gate insulating layer may be between the second gate insulating layer and the first active layer.

The first gate electrode may be above the first active layer, and the third gate electrode may be at a higher level than the third active layer.

The third gate insulating layer may be between the second gate insulating layer and the first gate electrode.

The first active layer and the third active layer may be on the same layer, and the second gate insulating layer may be on the first active layer.

The third gate insulating layer may be at a lower level than the second gate insulating layer.

BRIEF DESCRIPTION OF THE DRAWINGS

The above and other aspects and features of the present disclosure will become more apparent by describing exemplary embodiments thereof in more detail with reference to the attached drawings, in which.

DETAILED DESCRIPTION

The present disclosure will now be described more fully hereinafter with reference to the accompanying drawings, in which example embodiments of the disclosure are shown. This disclosure may, however, be embodied in different forms and should not be construed as limited to the embodiments set forth herein. Rather, these embodiments are provided so that this disclosure will be thorough and complete, and will filly convey the scope of the invention to those skilled in the art. As used herein, "exemplary" refers to example embodiments of the present disclosure.

It will also be understood that when a layer is referred to as being "on" another layer or substrate, it can be directly on the other layer or substrate, or intervening layers may also be present. When a layer is referred to as being "directly on" another layer or substrate, no intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, exemplary embodiments of the present disclosure will be described with reference to the accompanying drawings.

Figure 1:
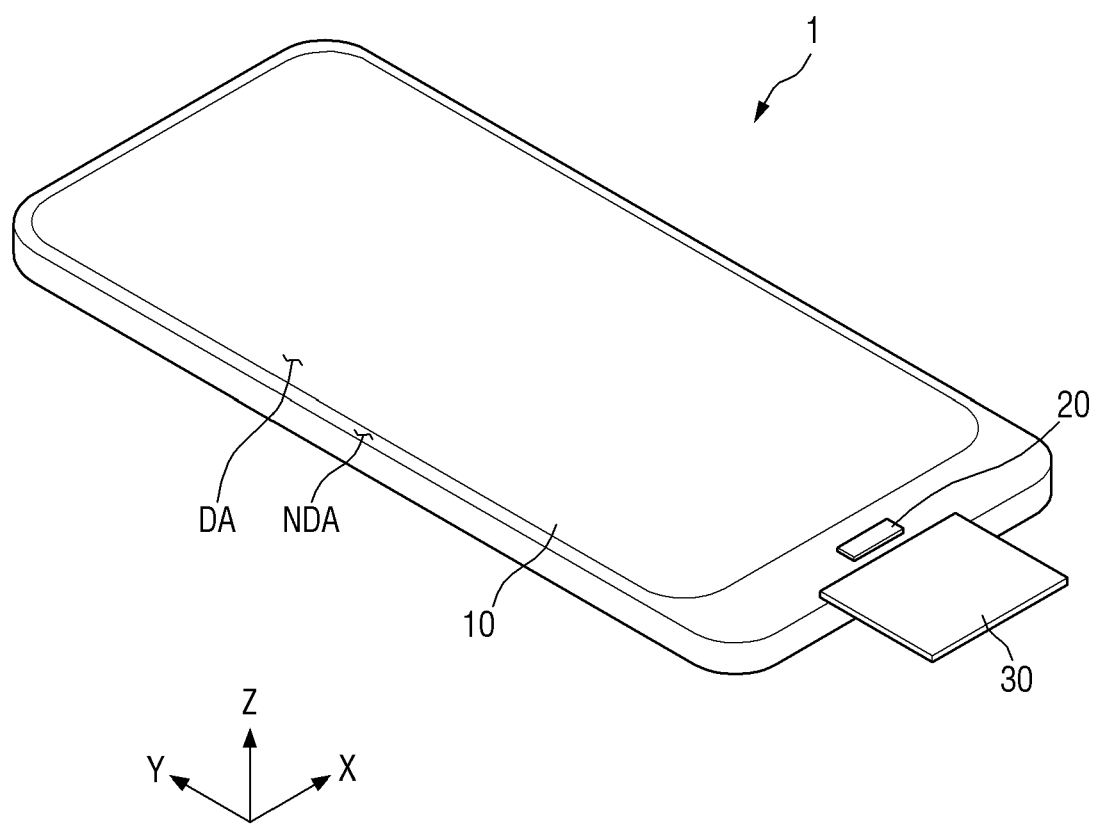
FIG. 1 is a perspective view illustrating a display device according to an exemplary embodiment.

FIG. 1 is a perspective view illustrating a display device according to an exemplary embodiment.

Referring to FIG. 1, a display device 1 may display a video and/or a still image. The display device 1 may refer to any electronic device that provides a display screen. For example, the display device 1 may include a television, a laptop computer, a monitor, a billboard, a device for Internet of Things, a mobile phone, a smartphone, a tablet personal computer (PC), an electronic watch, a smartwatch, a watch phone, a head-mounted display, a mobile communication terminal, an electronic notebook, an e-book, a portable multimedia player (PMP), a navigation system, a game console, a digital camera, and/or a camcorder, which are provided with a display screen.

The display device 1 includes a display panel 10 that provides a display screen. Examples of the display panel 10 may include a light-emitting diode (LED) display panel, an organic light-emitting display panel, a quantum dot light-emitting display panel, a plasma display panel, a field emission display panel, and the like. Hereinafter, although an embodiment, in which the LED display panel is applied as the example of the display panel of the device, is described, the present disclosure is not limited thereto, and other suitable display panels may be used (utilized) for a device to which the same technical spirit is applicable. Hereinafter, the display panel 10 will be mainly described as an organic light-emitting diode (OLED) display device, but the present disclosure is not limited thereto.

In the present specification, the terms "above," "upper portion," "top," and "upper surface" refer to an upward direction, that is, a Z-axis direction, based on the display panel 10, and the terms "below," "lower portion," "bottom," and "lower surface" refer to a downward direction, that is, a direction opposite to the Z-axis direction, based on the display panel 10. Further, the terms "left," "right," "upper," and "lower" refer to directions when the display panel 10 is viewed in a plan view. For example, the term "left" refers to a direction opposite to an X-axis direction, the term "right" refers to the X-axis direction, the term "upper" refers to a Y-axis direction, and the term "lower" refers to a direction opposite to the Y-axis direction.

A shape of the display device 1 may be variously suitably changed. For example, the display device 1 may have shapes such as a rectangular shape of which lateral sides are long, a rectangular shape of which longitudinal sides are long, a square shape, a quadrangular shape of which corner portions (vertexes) are round, other polygonal shapes, a circular shape, and/or the like. A shape of a display area DA of the display device 1 may also be similar to an overall shape of the display device 1. In FIG. 1, the display device 1 and the display area DA, which have the rectangular shape of which longitudinal sides are long, are illustrated, but the present disclosure is not limited thereto.

The display device 1 may include the display area DA and a non-display area NDA. The display area DA is an area in which an image may be displayed, and the non-display area NDA is an area in which an image may not be displayed. The display area DA may be referred to as an active area, and the non-display area NDA may be referred to as an inactive area.

In general, the display area DA may substantially occupy a center of the display device 1. The display area DA may include a plurality of pixels PX. The plurality of pixels PX may be arranged in a matrix form. A shape of each of the pixels PX may be a rectangular shape or a square shape in a plan view but is not limited thereto, and the shape may be a rhombus shape of which sides are inclined with respect to a first direction (X-axis direction).

The non-display area NDA may be around the display area DA. The non-display area NDA may completely or partially surround the display area DA. The display area DA has a rectangular shape, and the non-display area NDA may be arranged adjacent to four sides of the display area DA. The non-display area NDA may form a bezel of the display device 1.

Figure 2:
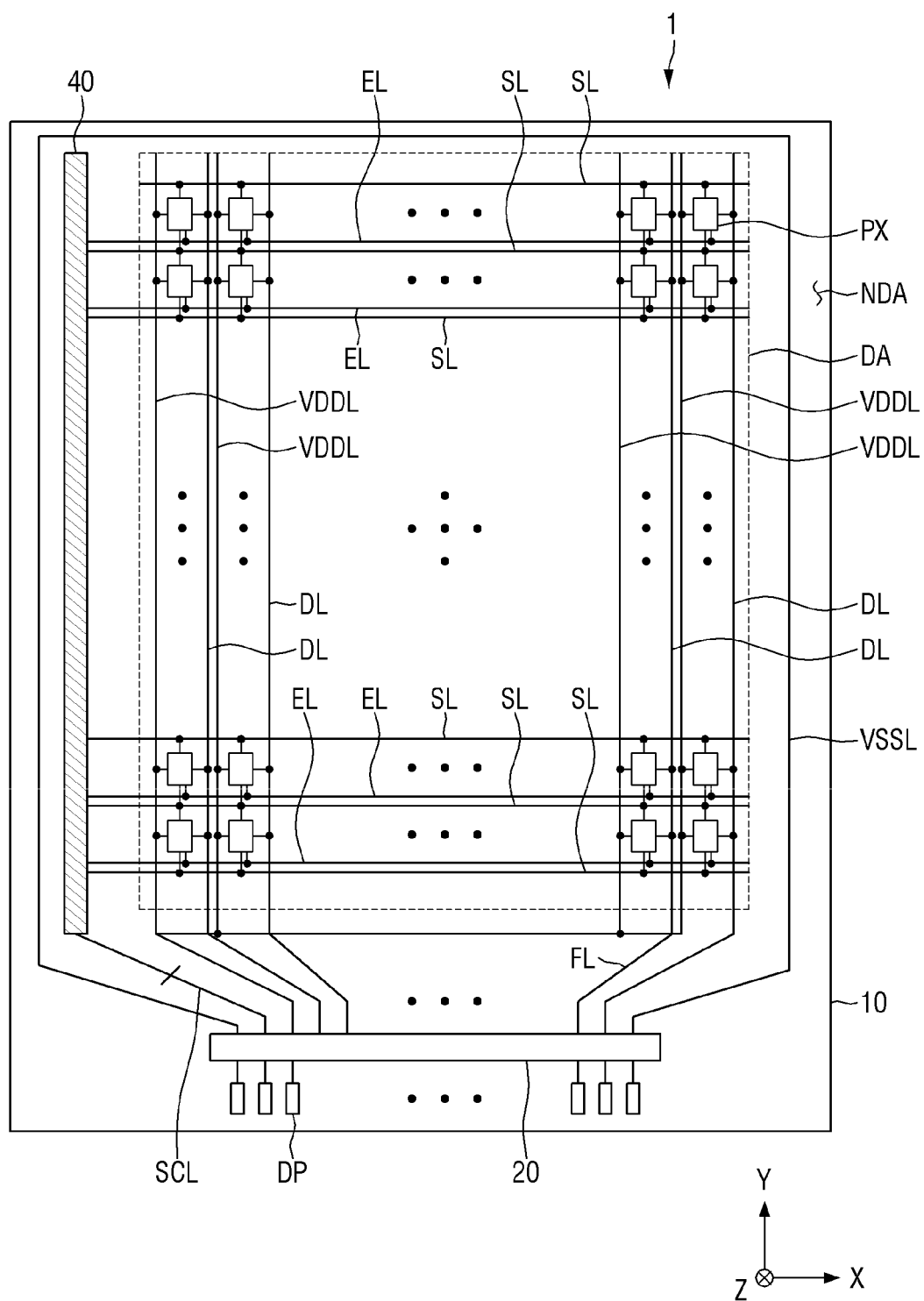
FIG. 2 is a plan view illustrating an example of the display device according to an exemplary embodiment.

FIG. 2 is a plan view illustrating an example of the display device according to an exemplary embodiment.

Referring to FIGS. 1 and 2, the display device 1 includes the display panel 10, a display driving circuit 20, and a circuit board 30.

The display panel 10 may be formed to have a rectangular-shaped flat surface that has short sides in (along) the first direction (X-axis direction) and long sides in (along) a second direction (Y-axis direction) intersecting (e.g., crossing) the first direction (X-axis direction). A corner at which the short side in the first direction (X-axis direction) meets the long side in the second direction (Y-axis direction) may be formed to be round with a predetermined (or set) curvature, or may be formed with a right angle. The planar shape of the display panel 10 is not limited to the rectangular shape but may be formed in another polygonal shape, circular shape, and/or elliptical shape. The display panel 10 may be formed to be flat but is not limited thereto, and the display panel 10 may include curved surface portions that are formed at left and right ends thereof, and may have a constant curvature or various (varying) curvatures. In addition, the display panel 10 may be formed to be flexible so as to be bendable, foldable, and/or rollable.

The display panel 10 may include the display area DA, in which the plurality of pixels PX are formed to display an image, and the non-display area NDA that is a peripheral area of the display area DA. In the display area DA, not only the pixels PX but also scan lines SL, emission lines EL, data lines DL, first voltage lines VDDL, and second voltage lines VSSL, which are connected to the pixels PX, may be positioned. The scan lines SL and the emission lines EL may extend in the first direction (X-axis direction) and may be formed to be substantially parallel to each other, and the data lines DL may extend in the second direction (Y-axis direction), intersecting (e.g., crossing) the first direction (X-axis direction), and may be formed to be substantially parallel to each other. The first voltage lines VDDL may extend in the second direction (Y-axis direction) in the display area DA and may be formed to be substantially parallel to each other. The first voltage lines VDDL, which are formed to be substantially parallel to each other in the second direction (Y-axis direction) in the display area DA, may be connected to each other in the non-display area NDA.

Each of the pixels PX may be connected to at least one of the scan lines SL, connected to at least one of the emission lines EL, connected to one of the data lines DL, and connected to the first voltage line VDDL. In addition, each of the pixels PX may be electrically connected to the second voltage line VSSL. In FIG. 2, each of the pixels PX is illustrated as being connected to two scan lines SL, one emission line EL, one data line DL, and one first voltage line VDDL, but the present disclosure is not limited thereto. For example, each of the pixels PX may be connected to three scan lines SL or one scan line SL.

Each of the pixels PX may include a plurality of transistors, a light-emitting element, and a capacitor. The plurality of transistors may include a driving transistor configured to control a driving current, which flows through the light-emitting element according to a data voltage applied to a gate electrode, and at least one switching transistor. The plurality of transistors may be thin-film transistors. The light-emitting element may emit light according to the driving current of the driving transistor. The capacitor may serve to constantly maintain the data voltage applied to the gate electrode of the driving transistor.

The non-display area NDA may be defined as a peripheral area of the display area DA. In the non-display area NDA, a scan driver 40 for applying scan signals to the scan lines SL, fan-out lines FL connected to pads DP, and the pads DP connected to the circuit board 30 may be positioned. The pads DP may be positioned at one side edge of the display panel 10.

The scan driver 40 may be connected to the pads DP through a plurality of scan control lines SCL. Thus, the scan driver 40 may receive a scan control signal of the display driving circuit 20 through the plurality of scan control lines SCL. The scan driver 40 may generate scan signals SC according to the scan control signal and sequentially output the scan signals to the scan lines SL.

The scan driver 40 may include a plurality of thin-film transistors. The scan driver 40 may be formed on the same layer (level) as or a different layer (level) from a layer (level) on which the thin-film transistors of the pixels PX are formed.

In FIG. 2, the scan driver 40 is illustrated as being formed in the non-display area NDA at one side of the display area DA, for example, at a left side of the display area DA, but the present disclosure is not limited thereto. For example, the scan driver 40 may be formed in the non-display areas NDA at both sides of the display area DA, for example, at left and right sides of the display area DA.

The display driving circuit 20 may be attached to the display panel 10 through a chip-on-glass (COG) method, a chip-on-plastic (COP) method, and/or an ultrasonic bonding method. In some embodiments, the display driving circuit 20 may be formed as an integrated circuit (IC) and may be on the circuit board 30. The display driving circuit 20 may include a timing controller and a data driver.

The timing controller receives digital video data and timing signals. The timing controller may generate the scan control signal for controlling an operation timing of the scan driver 40, and a data control signal for controlling an operation timing of the data driver according to the timing signals. The timing controller may also generate a power control signal for controlling an operation timing of a power supply circuit. The timing controller may output the scan control signal to the scan driver 40 through the plurality of scan control lines SCL, and output the digital video data and the data control signal to the data driver. The timing controller may output the power control signal to the power supply circuit.

The data driver converts the digital video data into analog positive/negative data voltages and outputs the analog positive/negative data voltages to the data lines DL through the fan-out lines FL. When the pixels PX are selected according to the scan signals of the scan driver 40, the data voltages are supplied to the selected pixels PX.

The power supply circuit may be formed as an IC and may be on the circuit board 30. The power supply circuit may generate a first voltage VDD according to an input power and the power control signal, and may supply the first voltage VDD to the first voltage line VDDL, may generate a second voltage VSS and supply the second voltage VSS to the second voltage line VSSL, and may generate an initialization voltage and supply the initialization voltage to an initialization voltage line Vint. The power supply circuit may generate various driving voltages required for driving the display device 1, in addition to the first voltage, the second voltage, and the initialization voltage. The power supply circuit may include a DC-DC converter.

The circuit board 30 may be attached onto the pads DP using an anisotropic conductive film. Accordingly, the circuit board 30 may be electrically connected to the pads DP. The circuit board 30 may be a flexible printed circuit board, a printed circuit board, or a flexible film such as a chip-on-film.

Figure 3:
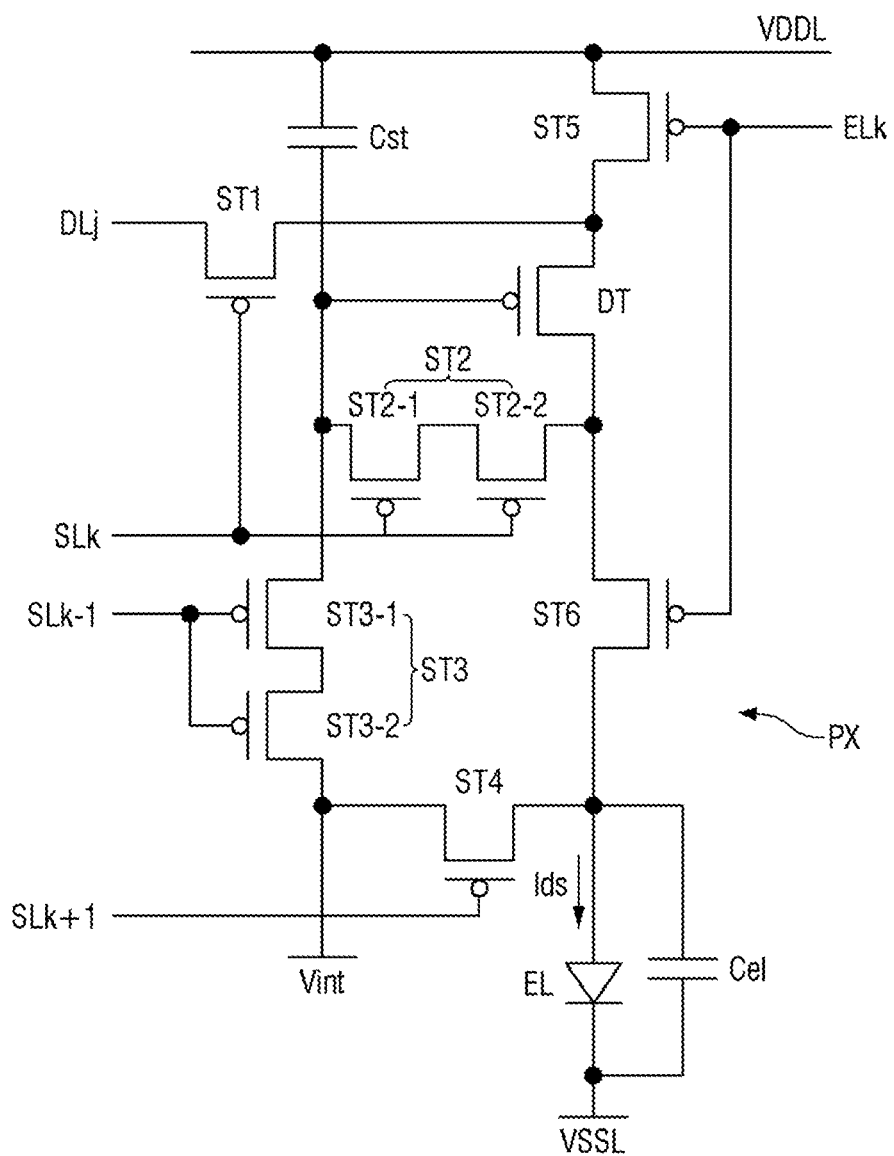
FIG. 3 is an equivalent circuit diagram illustrating a pixel of the device of FIG. 2.

FIG. 3 is an equivalent circuit diagram illustrating one pixel of FIG. 2.

Referring to FIG. 3, the pixel PX may be connected to a $(k-1)^{th}$ scan line SLk-1 (k is a positive integer), a $k^{th}$ scan line SLk, a $(k+1)^{th}$ scan line (SLk+1), and a $j^{th}$ data line DLj (j is a positive integer). In addition, each pixel PX may be connected to the first voltage line VDDL to which the first voltage VDD is applied, and the second voltage line VSSL to which the second voltage VSS is applied, and the initialization voltage line Vint to which the initialization voltage is applied.

According to an exemplary embodiment, each pixel PX may include a light-emitting element EL, a driving transistor DT, first to sixth switching transistors ST1, ST2, ST3, ST4, ST5, and ST6, and a first capacitor Cst. FIG. 3 illustrates that each pixel PX has a seven transistor-one capacitor (7T1C) structure that includes one driving transistor DT, six switching transistors ST1, ST2, ST3, ST4, ST5, and ST6, and one capacitor Cst. However, the present disclosure is not limited thereto, and each pixel PX may include a larger number of transistors and/or capacitors.

FIG. 3 illustrates that the driving transistor DT and the first to sixth switching transistors ST1, ST2, ST3, ST4, ST5, and ST6 are formed as P-type metal-oxide-semiconductor (PMOS) transistors, but the present disclosure is not limited thereto. For example, the driving transistor DT and the first to sixth switching transistors ST1, ST2, ST3, ST4, ST5, and ST6 may be formed as N-type MOS (NMOS) transistors, or one or more of the driving transistor DT and the first to sixth switching transistors ST1, ST2, ST3, ST4, ST5, and ST6 may be formed as PMOS transistors and the remainder thereof may be formed as NMOS transistors. The PMOS transistor is turned on by a gate-on voltage that is lower than a gate-off voltage, and the NMOS transistor is turned on by a gate-on voltage that is higher than a gate-off voltage.

The light-emitting element EL emits light according to a driving current Ids of the driving transistor DT. The emission luminance of the light-emitting element EL may be proportional to the driving current Id.

The light-emitting element EL may be an OLED including a first electrode, a second electrode, and an organic light-emitting layer between the first electrode and the second electrode. In some embodiments, as the light-emitting element EL, instead of the OLED, an inorganic light-emitting diode including a first electrode, a second electrode, and an inorganic semiconductor between the first electrode and the second electrode may be used. In some embodiments, as the light-emitting element EL, instead of the OLED, a quantum dot light-emitting diode, which includes a first electrode, a second electrode, and a quantum dot light-emitting layer between the first electrode and the second electrode, or a micro light-emitting diode, may be used.

A first electrode of the light-emitting element EL may be connected to a first electrode of the fourth switching transistor ST4 and a second electrode of the sixth switching transistor ST6, and a second electrode thereof may be connected to the second voltage line VSSL. A parasitic capacitance Cel may be formed between the first electrode and the second electrode of the light-emitting element EL.

The driving transistor DT may control a drain-source current Ids (hereinafter, refers to as a driving current) according to a data voltage applied to a gate electrode thereof. In the driving transistor DT, the driving current Ids flowing through a channel is proportional to the square of a difference between a voltage $V_{GS}$ (between the gate electrode and a first electrode) and a threshold voltage.

The first switching transistor ST1 is turned on by a scan signal of the $k^{th}$ scan line SLk and connects the first electrode of the driving transistor DT and the $j^{th}$ data line DLj. A gate electrode of the first switching transistor ST1 may be connected to the $k^{th}$ scan line SLk, a first electrode thereof may be connected to the first electrode of the driving transistor DT, and a second electrode thereof may be connected to the data line DLj.

The second switching transistor ST2 may be formed as a dual transistor that includes a $(2-1)^{th}$ switching transistor ST2-1 and a $(2-2)^{th}$ switching transistor ST2-2. The $(2-1)^{th}$ switching transistor ST2-1 and the $(2-2)^{th}$ switching transistor ST2-2 are turned on by the scan signal of the $k^{th}$ scan line SLk and connect the gate electrode and a second electrode of the driving transistor DT. That is, when the $(2-1)^{th}$ switching transistor ST2-1 and the $(2-2)^{th}$ switching transistor ST2-2 are turned on, the gate electrode and the second electrode of the driving transistor DT are connected so that the driving transistor DT is operated as a diode. In the $(2-1)^{th}$ switching transistor ST2-1, a gate electrode may be connected to the $k^{th}$ scan line SLk, a first electrode may be connected to a second electrode of the $(2-2)^{th}$ switching transistor ST2-2, and a second electrode may be connected to the gate electrode of the driving transistor DT. In the $(2-2)^{th}$ switching transistor ST2-2, a gate electrode may be connected to the $k^{th}$ scan line SLk, a first electrode may be connected to the second electrode of the driving transistor DT, and the second electrode may be connected to the first electrode of the $(2-1)^{th}$ switching transistor ST2-1.

The third switching transistor ST3 may be formed as a dual transistor that includes a $(3-1)^{th}$ switching transistor ST3-1 and a $(3-2)^{th}$ switching transistor ST3-2. The $(3-1)^{th}$ switching transistor ST3-1 and the $(3-2)^{th}$ switching transistor ST3-2 are turned on by a scan signal of the $(k-1)^{th}$ scan line SLk-1 and connect the gate electrode of the driving transistor DT to the initialization voltage line Vint. The gate electrode of the driving transistor DT may be discharged to have the initialization voltage of the initialization voltage line Vint. In the $(3-1)^{th}$ switching transistor ST3-1, a gate electrode may be connected to the $(k-1)^{th}$ scan line SLk-1, a first electrode may be connected to the gate electrode of the driving transistor DT, and a second electrode may be connected to a first electrode of the $(3-2)^{th}$ switching transistor ST3-2. In the $(3-2)^{th}$ switching transistor ST3-2, a gate electrode may be connected to the $(k-1)^{th}$ scan line SLk-1, the first electrode may be connected to the second electrode of the $(3-1)^{th}$ switching transistor ST3-1, and a second electrode may be connected to the initialization voltage line Vint.

The fourth switching transistor ST4 is turned on by a scan signal of the $(k+1)^{th}$ scan line SLk+1 and connects the first electrode of the light-emitting element EL to the initialization voltage line Vint. The first electrode of the light-emitting element EL may be discharged to have the initialization voltage. In the fourth switching transistor ST4, a gate electrode is connected to the $(k+1)^{th}$ scan line SLk+1, the first electrode is connected to the first electrode of the light-emitting element EL, and a second electrode is connected to the initialization voltage line Vint.

The fifth switching transistor ST5 is turned on by an emission control signal of a $k^{th}$ emission line ELk and connects the first electrode of the driving transistor DT to the first voltage line VDDL. In the fifth switching transistor ST5, a gate electrode is connected to the $k^{th}$ emission line ELk, a first electrode is connected to the first voltage line VDDL, and a second electrode is connected to the first electrode of the driving transistor DT.

The sixth switching transistor ST6 is between the second electrode of the driving transistor DT and the first electrode of the light-emitting element EL. The sixth switching transistor ST6 is turned on by the emission control signal of the $k^{th}$ emission line ELk and connects the second electrode of the driving transistor DT and the first electrode of the light-emitting element EL. In the sixth switching transistor ST6, a gate electrode is connected to the $k^{th}$ emission line ELk, a first electrode is connected to the second electrode of the driving transistor DT, and a second electrode is connected to the first electrode of the light-emitting element EL. When both the fifth switching transistor ST5 and the sixth switching transistor ST6 are turned on, the driving current Ids may be supplied to the light-emitting element EL.

The first capacitor Cst is formed between the gate electrode of the driving transistor DT and the first voltage line VDDL. In the first capacitor Cst, one electrode may be connected to the gate electrode of the driving transistor DT, and the other electrode may be connected to the first voltage line VDDL. The first capacitor Cst may serve to maintain the voltage of the gate electrode of the driving transistor DT for one frame period.

Meanwhile, when the first electrode of each of the driving transistor DT and the first to sixth switching transistors ST1, ST2, ST3, ST4, ST5, and ST6 is a source electrode, the second electrode thereof may be a drain electrode. Alternatively, when the first electrode of each of the driving transistor DT and the first to sixth switching transistors ST1, ST2, ST3, ST4, ST5, and ST6 is a drain electrode, the second electrode thereof may be a source electrode.

Active layers of the driving transistor DT and the first to sixth switching transistors ST1, ST2, ST3, ST4, ST5, and ST6 may be made of polysilicon, amorphous silicon, and/or an oxide semiconductor. However, the present disclosure is not limited thereto, and the active layers of some of the driving transistor DT and the first to sixth switching transistors ST1, ST2, ST3, ST4, ST5, and ST6 may be made of polysilicon, and the active layers of the remainder thereof may be made of an oxide semiconductor.

In the display device 1 according to an exemplary embodiment, transistors of which active layers are made of polysilicon and transistors of which active layers are made of an oxide semiconductor may be positioned in a mixed manner. In the driving transistor DT and the switching transistors ST of the display device 1, types (or kinds) of the active layers (e.g., types (or kinds) of materials forming the active layers) may be changed depending on element characteristics required for each transistor. For example, in the first switching transistor ST1, of which one electrode is connected to the data line DLj, the active layer may be made of polysilicon, and in the driving transistor DT and the second switching transistor ST2, the active layers may be made of an oxide semiconductor. In this case, the active layers of the driving transistor DT, the first switching transistor ST1, and the second switching transistor ST2 may be on different layers (levels).

However, when a transistor includes an active layer made of an oxide semiconductor, physical properties required for the transistor may not be sufficiently secured, and thus element characteristics may be reduced. In this case, element characteristics of transistors including an active layer made of an oxide semiconductor may be secured by adjusting the thickness or material of a gate insulating layer disposed between the active layer and the gate electrode of each transistor. The display device 1 according to an exemplary embodiment includes transistors including an active layer made of an oxide semiconductor, and in the transistors, gate insulating layers between a gate electrode and an active layer of each transistor may have different thicknesses. As described above, transistors including different types (or kinds) of active layers may be positioned on different layers (levels), and different gate insulating layers may be positioned on the respective active layers. For example, in the display device 1, the different gate insulating layers may be positioned on the respective active layers, and even when transistors include active layers made of different materials, element characteristics may be secured at a predetermined (or set) level or more (higher). This will be described in more detail with reference to other drawings.

Figure 4:
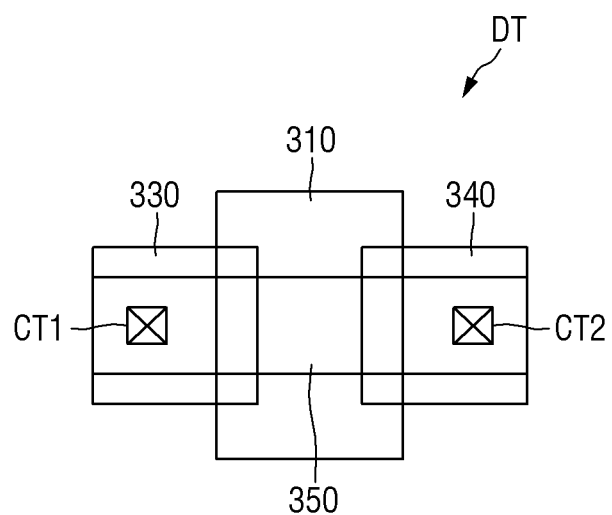
FIG. 4 is a schematic plan view illustrating a driving transistor according to an exemplary embodiment.
Figure 5:
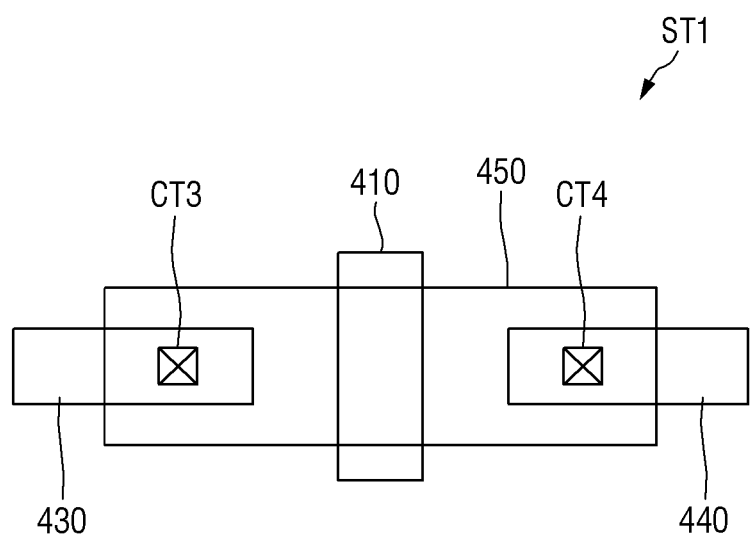
FIG. 5 is a schematic plan view illustrating a first switching transistor according to an exemplary embodiment.
Figure 6:
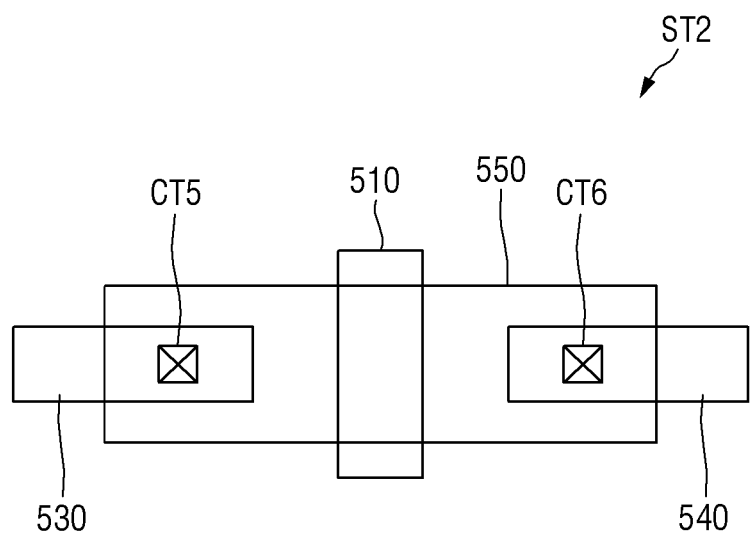
FIG. 6 is a schematic plan view illustrating a second switching transistor according to an exemplary embodiment.
Figure 7:
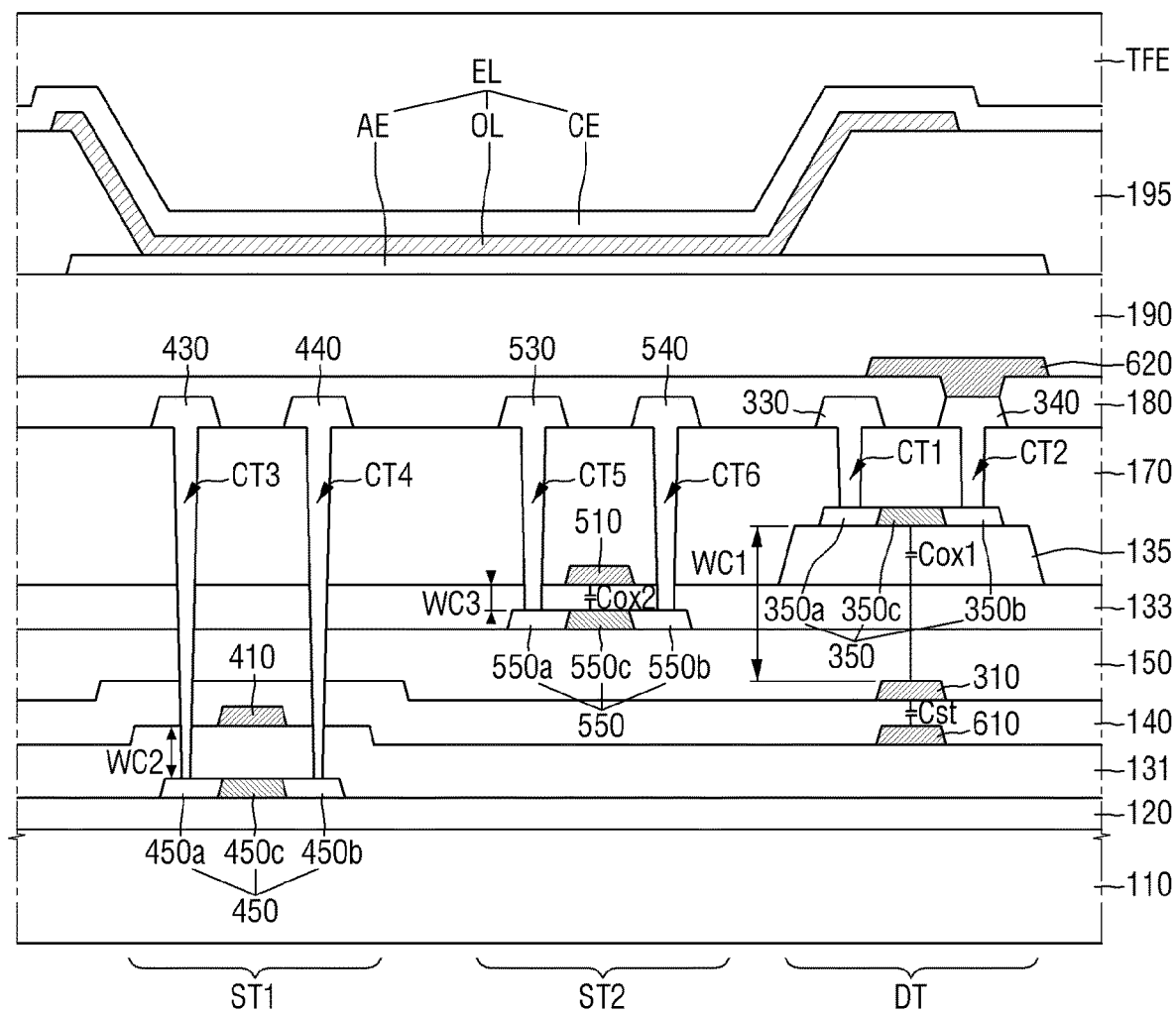
FIG. 7 is a cross-sectional view illustrating a portion of the display device according to an exemplary embodiment.

FIG. 4 is a schematic plan view illustrating the driving transistor according to an exemplary embodiment. FIG. 5 is a schematic plan view illustrating the first switching transistor according to an exemplary embodiment. FIG. 6 is a schematic plan view illustrating the second switching transistor according to an exemplary embodiment. FIG. 7 is a cross-sectional view illustrating a portion of the display device according to an exemplary embodiment.

FIGS. 4 to 6 illustrate schematic plan views of the driving transistor DT, the first switching transistor ST1, and the second switching transistor ST2. FIG. 7 illustrates a cross-section view illustrating the driving transistor DT, the first switching transistor ST1, and the second switching transistor ST2. However, FIGS. 4 to 7 illustrate schematic structures of the components, and the planar shapes of the transistors and the sectional shape of the display device 1 are not limited thereto.

Specifically, referring to FIGS. 4 to 7, the display device 1 may include a first substrate 110, and a plurality of conductive layers, a plurality of semiconductor layers, and a plurality of insulating layers, which are on the first substrate 110. The display device 1 includes a first semiconductor layer, a first gate conductive layer, a second gate conductive layer, a second semiconductor layer, a third semiconductor layer, a third gate conductive layer, a first data conductive layer, and a second data conductive layer as the conductive layers and the semiconductor layers. Each of the plurality of conductive layers and each of the plurality of semiconductor layers may constitute the active layer, the gate electrode, and/or the source/drain electrodes of the driving transistor DT, the first switching transistor ST1, and the second switching transistor ST2. In addition, the display device 1 may include a buffer layer 120, a first gate insulating layer 131, a first protective layer 140, a first interlayer insulating layer 150, a second gate insulating layer 133, a third gate insulating layer 135, a second interlayer insulating layer 170, a second protective layer 180, and a first planarizing film 190 as the plurality of insulating layers.

The driving transistor DT includes a first active layer 350, a first gate electrode 310, and source/drain electrodes 330 and 340. The first switching transistor ST1 includes a second active layer 450, a second gate electrode 410, and source/drain electrodes 430 and 440. The second switching transistor ST2 includes a third active layer 550, a third gate electrode 510, and source/drain electrodes 530 and 540.

FIGS. 4 to 7 illustrate that, in the pixel PX, the driving transistor DT has a bottom gate structure, in which a gate electrode is below an active layer, and the first switching transistor ST1 and the second switching transistor ST2 have a top gate structure, in which a gate electrode is above an active layer. However, the present disclosure is not limited thereto, and in each pixel PX, the gate electrode of each of the driving transistor DT, the first switching transistor ST1, and the second switching transistor ST2 may be above or below the active layer.

In addition, other switching transistors not illustrated in FIGS. 4 to 7, for example, the third to sixth switching transistors ST3, ST4, ST5, and ST6, may each have a structure that is similar to that of the first switching transistor ST1 or the second switching transistor ST2. For example, the third switching transistor ST3 may have the same structure as the second switching transistor ST2, and the fourth switching transistor ST4, the fifth switching transistor ST5, and the sixth switching transistor ST6 may each have the same structure as the first switching transistor ST1.

Meanwhile, in the display device 1 according to an exemplary embodiment, the active layers of the driving transistor DT, the first switching transistor ST1, and the second switching transistor ST2 may be on different layers (levels). As illustrated in the drawings, the driving transistor DT and the second switching transistor ST2 may be positioned at a higher level than the first switching transistor ST1, and the second switching transistor ST2 and the driving transistor DT may be on the same layer (level) or different layers (levels). Accordingly, the active layers of the driving transistor DT, the first switching transistor ST1, and the second switching transistor ST2, and the gate insulating layers on the active layers, may be formed through different processes. Depending on element characteristics required for the driving transistor DT, the first switching transistor ST1, and the second switching transistor ST2, the active layers and corresponding gate insulating layers thereof may have different physical properties. Hereinafter, the structure of the display device 1 including the driving transistor DT, the first switching transistor ST1, and the second switching transistor ST2 will be described in more detail.

The first substrate 110 may provide a region in which the driving transistor DT, the first switching transistor ST1, and the second switching transistor ST2 are formed. The first substrate 110 may be made of plastic and/or glass.

The buffer layer 120 may be positioned on the first substrate 110. The buffer layer 120 may be formed on the first substrate 110 to protect the transistors of the pixel PX and an organic light-emitting layer OL of the light-emitting element EL from moisture penetrating through the first substrate 110 (that is vulnerable to moisture permeation). The buffer layer 120 may be formed of a plurality of inorganic layers that are alternately stacked. For example, the buffer layer 120 may be formed in a multi-layer structure in which one or more inorganic layers selected from a silicon oxide layer ($SiO_x$), a silicon nitride layer ($SiN_x$), and a silicon oxynitride (SiON) layer are alternately stacked.

The first semiconductor layer may be positioned on the buffer layer 120. The first semiconductor layer may include the second active layer 450 of the first switching transistor ST1. In some exemplary embodiments, the first semiconductor layer including the second active layer 450 may be made of polycrystalline silicon, single-crystal silicon, low-temperature polycrystalline silicon, and/or amorphous silicon.

The second active layer 450 may include a first doped region 450*a*, a second doped region 450*b*, and a channel region 450*c*. The channel region 450*c* may be between the first doped region 450*a* and the second doped region 450*b*. The first doped region 450*a* and the second doped region 450*b* may be respectively in contact with the source/drain electrodes 430 and 440 of the first switching transistor ST1 which will be described in more detail below.

Meanwhile, the first semiconductor layer may include not only the second active layer 450 of the first switching transistor ST1 but also the active layers of other switching transistors, for example, the fourth to sixth switching transistors ST4, ST5, and ST6. In some exemplary embodiments, the first semiconductor layer may also include one electrode of the first capacitor Cst. This will be described in more detail below with reference to other exemplary embodiments.

The first gate insulating layer 131 may be on the first semiconductor layer. The first gate insulating layer 131 may be on the buffer layer 120 including at least the second active layer 450. For example, the first gate insulating layer 131 may also be on a portion of the buffer layer 120, on which the second active layer 450 is not positioned, including a region overlapping the channel region 450c of the second active layer 450. In the drawing, the first gate insulating layer 131 is illustrated as being positioned so as to cover an entirety of the buffer layer 120 including an upper surface and side surfaces of the second active layer 450, but the present disclosure is not limited thereto. In some cases, the first gate insulating layer 131 may be only on the upper surface of the second active layer 450 and thus may be only between the second gate electrode 410 and the second active layer 450 which will be described in more detail below.

The first gate insulating layer 131 may be made of an inorganic material such as $SiO_x$, $SiN_x$, or a combination or stacked structure thereof.

The first gate conductive layer may be on the first gate insulating layer 131. The first gate conductive layer may include one electrode 610 of the first capacitor Cst and the second gate electrode 410 of the first switching transistor ST1.

The second gate electrode 410 may overlap a partial region of the second active layer 450 with the first gate insulating layer 131 interposed therebetween. For example, as illustrated in the drawing (e.g., in FIG. 7), the second gate electrode 410 may be in a region overlapping the second active layer 450 in a thickness direction thereof on the first gate insulating layer 131. A width of the second gate electrode 410, which is measured in one direction, may be smaller than a width of the second active layer 450 which is measured in the one direction. The second gate electrode 410 may be positioned to overlap at least the channel region 450c of the second active layer 450. The width of the second gate electrode 410, which is measured in the one direction, may be substantially the same as a width of the channel region 450c of the second active layer 450.

The one electrode 610 of the first capacitor Cst may be on the first gate insulating layer 131 and may be at a position overlapping the first gate electrode 310 of the driving transistor DT in a thickness direction thereof. The one electrode 610 of the first capacitor Cst may be opposite to the first gate electrode 310, and the first capacitor Cst may be formed therebetween. However, the one electrode 610 of the first capacitor Cst may not necessarily be in the first gate conductive layer. In some exemplary embodiments, a partial region of the first semiconductor layer made of polysilicon may be a conductor to form the one electrode 610 of the first capacitor Cst. In this case, the first capacitor Cst may be formed between the first semiconductor layer and the first gate electrode 310. FIG. 7 illustrates that the one electrode 610 of the first capacitor Cst is at a lower level than the first gate electrode 310 of the driving transistor DT, but in some embodiments, the one electrode 610 of the first capacitor Cst may be at a higher level than the first gate electrode 310.

The first gate conductive layer may be formed as a single layer or a multi-layer that is made of one selected from molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The first protective layer 140 may be positioned on the first gate conductive layer. The first protective layer 140 may be positioned so as to cover the first gate insulating layer 131, including being on the second gate electrode 410 and the one electrode 610 of the first capacitor Cst. The first protective layer 140 may be made of, for example, $SiO_x$, $SiN_x$, or a stacked structure thereof. Contact holes CT3 and CT4, which pass through the first protective layer 140 to partially expose the second active layer 450, may be formed in the first protective layer 140.

The second gate conductive layer may be on the first protective layer 140. The second gate conductive layer may include the first gate electrode 310 of the driving transistor DT.

The first gate electrode 310 of the driving transistor DT may be above the one electrode 610 of the first capacitor Cst with the first protective layer 140 interposed therebetween. At least a portion of the first gate electrode 310 may overlap the one electrode 610 of the first capacitor Cst, and the first capacitor Cst may be formed therebetween. For example, the first gate electrode 310 may be the other electrode of the first capacitor Cst.

In some embodiments, the first gate electrode 310 may overlap the first active layer 350 which will be described in more detail below. As described above, the driving transistor DT may have a bottom gate structure, in which the first gate electrode 310 is below the first active layer 350. The first gate electrode 310 may overlap at least the channel region 350c of the first active layer 350 in a thickness direction thereof.

The second gate conductive layer may be formed as a single layer or a multi-layer that is made of one selected from molybdenum (Mo), aluminum (Al), chromium (Cr), gold (Au), titanium (Ti), nickel (Ni), neodymium (Nd), and copper (Cu) or an alloy thereof. However, the present disclosure is not limited thereto The first interlayer insulating layer 150 may be positioned on the second gate conductive layer. For example, the first interlayer insulating layer 150 may be formed so as to cover an entire surface of the first protective layer 140, including the first gate electrode 310 of the driving transistor DT. A plurality of contact holes passing through the first interlayer insulating layer 150 may be formed in the first interlayer insulating layer 150.

In some embodiments, the first active layer 350 of the driving transistor DT may be at a higher level than the first interlayer insulating layer 150. In this case, the first interlayer insulating layer 150 may be between the first gate electrode 310 and the first active layer 350 of the driving transistor DT. Accordingly, a partial region of the first interlayer insulating layer 150 may constitute a gate insulating layer of the driving transistor DT.

The first interlayer insulating layer 150 may be made of, for example, an inorganic material such as $SiO_x$, $SiN_x$, or a combination or a stacked structure thereof.

In some embodiments, the display device 1 may include the first switching transistor ST1 of which the active layer is made of polysilicon, and the driving transistor DT and the second switching transistor ST2, of which the active layers are made of an oxide semiconductor, and the active layers may be positioned on different layers (levels). The second active layer 450 of the first switching transistor ST1 may be below the first interlayer insulating layer 150, and the first active layer 350 of the driving transistor DT and the third active layer 550 of the second switching transistor ST2 may be above the first interlayer insulating layer 150. The active layers made of different materials, may be formed by performing different processes in a process of manufacturing the display device 1, and may be positioned on different layers (levels).

The second semiconductor layer, the third semiconductor layer, and the third gate conductive layer may be on the first interlayer insulating layer 150. In addition, one or more gate insulating layers, for example, the second gate insulating layer 133 and the third gate insulating layer 135, may be on the first interlayer insulating layer 150.

The second semiconductor layer may include the third active layer 550 of the second switching transistor ST2, and the third semiconductor layer may include the first active layer 350 of the driving transistor DT. In the drawing (FIG. 7), the first active layer 350 and the third active layer 550 are illustrated as being on different layers (levels) to respectively constitute the third semiconductor layer and the second semiconductor layer, but the present disclosure is not limited thereto. In some exemplary embodiments, the first active layer 350 of the driving transistor DT and the third active layer 550 of the second switching transistor ST2 may be included in the second semiconductor layer, and thus the third semiconductor layer may be omitted.

The first active layer 350 may be in a region overlapping the first gate electrode 310 of the second gate conductive layer positioned below the first interlayer insulating layer 150 in a thickness direction thereof. On the other hand, the third active layer 550 may be in a region not overlapping the first semiconductor layer, the first gate conductive layer, or the second gate conductive layer positioned below the first interlayer insulating layer 150 in a thickness direction thereof. However, the present disclosure is not limited thereto.

In some exemplary embodiments, the second semiconductor layer including the third active layer 550 and the third semiconductor layer including the first active layer 350 may be made of an oxide semiconductor. In exemplary embodiments, the oxide semiconductor may include indium tin oxide (ITO), indium tin gallium oxide (ITGO), indium gallium zinc oxide (IGZO), and/or indium gallium zinc tin oxide (IGZTO).

The first active layer 350 may include a first conductive region 350a, a second conductive region 350b, and a channel region 350c. The channel region 350c may be between the first conductive region 350a and the second conductive region 350b. The first conductive region 350a and the second conductive region 350b may be respectively in contact with the source/drain electrodes 330 and 340 of the driving transistor DT, which will be described below in more detail.

The third active layer 550 may include a third conductive region 550a, a fourth conductive region 550b, and a channel region 550c. The channel region 550c may be between the third conductive region 550a and the fourth conductive region 550b. The third conductive region 550a and the fourth conductive region 550b may be respectively in contact with the source/drain electrodes 530 and 540 of the second switching transistor ST2, which will be described below in more detail.

Furthermore, in an exemplary embodiment, in the first active layer 350 and the third active layer 550 of the third semiconductor layer and the second semiconductor layer, a length of each of the channel regions 350c and 550c may be the same as a length of the channel region 450c of the second active layer 450 of the first semiconductor layer. The first active layer 350 and the third active layer 550 made of an oxide semiconductor may have element characteristics that are lower than element characteristics of the second active layer 450 made of polysilicon. However, the driving transistor DT and the second switching transistor ST2 including the first active layer 350 and the third active layer 550 may secure excellent (or suitable) element characteristics by adjusting a distance between the first active layer 350 and the first gate electrode 310, and/or between the third active layer 550 and the third gate electrode 510. The lengths of the channel regions of the active layers may be substantially the same.

The third gate conductive layer may be on the second semiconductor layer or the third semiconductor layer. The third gate conductive layer may include the third gate electrode 510 of the second switching transistor ST2.

The third gate electrode 510 of the second switching transistor ST2 may be above the third active layer 550 with the second gate insulating layer 133 interposed therebetween. The third gate electrode 510 may overlap at least the channel region 550c of the third active layer 550 in a thickness direction thereof. However, the present disclosure is not limited thereto. The third gate electrode 510 of the second switching transistor ST2 is not necessarily above the third active layer 550, but may be positioned below the third active layer 550. Thus, the second switching transistor ST2 may have a bottom gate structure. In this case, the third gate electrode 510 may be included in the first gate conductive layer or the second gate conductive layer.

Meanwhile, the third gate conductive layer may further include another electrode, in addition to the third gate electrode 510. For example, when the driving transistor DT has a top gate structure, the first gate electrode 310 of the driving transistor DT may be above the first active layer 350 and thus may be in the third gate conductive layer. In addition, the third gate conductive layer may further include an electrode above the first active layer 350 to perform a function of a light blocking film configured to prevent or reduce light from being incident on the first active layer 350 made of an oxide semiconductor. However, the present disclosure is not limited thereto.

The third gate conductive layer may be formed as a single layer or a multi-layer that is made of one selected from molybdenum (Mo), aluminum (Al), chromium (Cr), gold (Au), titanium (Ti), nickel (Ni), neodymium (Nd), and copper (Cu) or an alloy thereof. However, the present disclosure is not limited thereto One or more gate insulating layers may be further positioned on the first interlayer insulating layer 150. For example, the second gate insulating layer 133 and the third gate insulating layer 135 may be on the first interlayer insulating layer 150. The second gate insulating layer 133 and the third gate insulating layer 135 may include substantially the same material as the first gate insulating layer 131.

The second gate insulating layer 133 may be on the first interlayer insulating layer 150 and may be between the third active layer 550 and the third gate electrode 510 of the second switching transistor ST2. The third gate insulating layer 135 may be on the second gate insulating layer 133 and may be between the first active layer 350 and the first gate electrode 310 of the driving transistor DT. The first active layer 350 may be on the third gate insulating layer 135.

A gate insulating layer may be between a gate electrode and an active layer of a transistor, and gate capacitance Cox may be formed in the gate insulating layer by the gate electrode and the active layer. The gate capacitance Cox is changed according to a material included in the gate insulating layer or a thickness of the gate insulating layer. The gate capacitance Cox is changed in inverse proportion to the thickness of the gate insulating layer. For example, when the thickness of the gate insulating layer increases, the gate capacitance Cox decreases.

In one or more embodiments, the driving current Ids flowing through a channel of the driving transistor DT may be defined by Expression 1 below:

$$I_{DS\cdot sat} = \frac{1}{2}\mu_{sat}C'_{ox}\frac{W}{L}(V_{GS}-V_T)^2 \qquad \text{Expression 1}$$

In Expression 1, "$I_{DS}$" refers to the driving current Ids flowing in the driving transistor DT, "$\mu_{sat}$" refers to saturation mobility, "$C'_{ox}$" refers to the gate capacitance by the gate insulating layer, "W" refers to an area of the channel region of the driving transistor, "L" refers to a length of the channel region of the driving transistor, "$V_{GS}$" refers to a gate-source voltage of the driving transistor DT, and "$V_T$" refers to a threshold voltage of the driving transistor DT.

According to Expression 1, when the saturation mobility $\mu_{sat}$ and the area W and the length L of the channel region of the driving transistor DT are determined by physical characteristics, it can be seen that the driving current Ids and a range of the driving voltage $V_{GS}$ are changed according to the gate capacitance by the gate insulating layer.

As described above, in the driving transistor DT, the first active layer 350 may be made of an oxide semiconductor. When gate insulating layers are the same in driving transistors, in order to secure the same driving voltage as in the case in which an active layer is made of polysilicon, an active layer made of an oxide semiconductor needs to secure a longer channel region. In this case, an area occupied by the driving transistor DT may be increased for each pixel PX, and it may be difficult to implement the high resolution display device 1 including a large number of pixels PX per unit area.

However, as shown in Expression 1, even when the driving transistor DT includes the active layer made of an oxide semiconductor, the driving current Ids of the driving transistor DT may be adjusted by adjusting the gate capacitance $C_{ox}$, that is, the thickness of the gate insulating layer. In other words, the range of the driving voltage allowing the driving transistor DT to have the driving current Ids within a specific range may be widened by adjusting a value of the gate capacitance $C_{ox}$.

Figure 8:
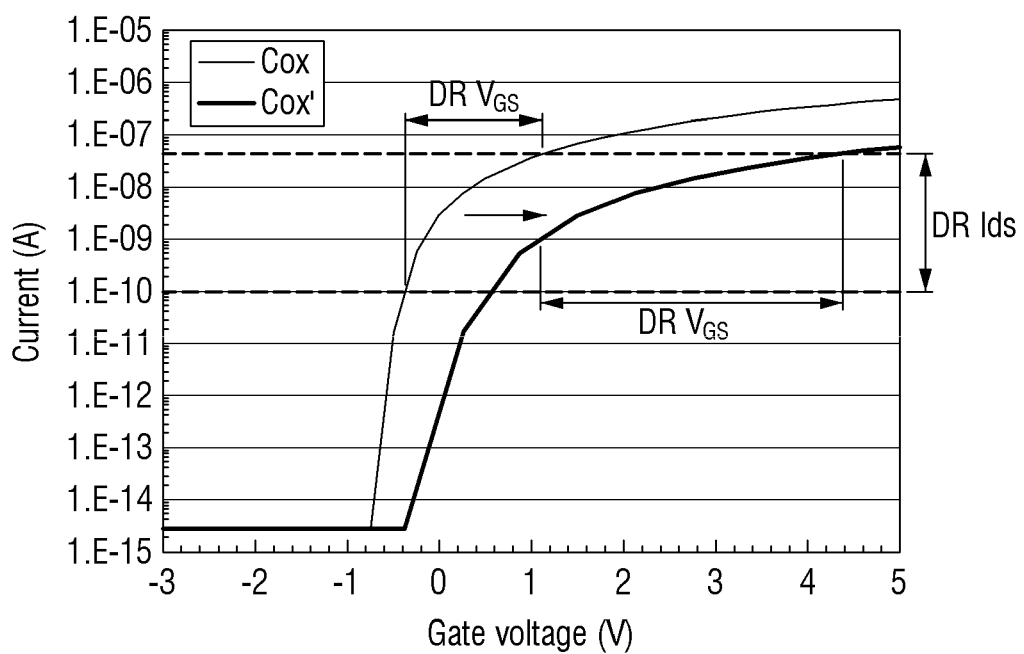
FIG. 8 is a graph showing changes in gate voltage ($V_{GS}$) and driving current (A) according to a change in capacitance of a transistor.

FIG. 8 is a graph showing changes in gate voltage $V_{GS}$ and driving current (A) according to a change in capacitance of a transistor.

FIG. 8 shows a change in driving current (A) according to gate voltages $V_{GS}$ of transistors which include active layers made of an oxide semiconductor and gate insulating layers having different thicknesses. A gate capacitance Cox of FIG. 8 indicates a gate voltage $V_{GS}$-driving current (A) graph of a transistor which includes a thin gate insulating layer and thus has a large gate capacitance value, and a gate capacitance Cox' of FIG. 8 indicates a gate voltage $V_{GS}$-driving current (A) graph of a transistor which includes a thick gate insulating layer and thus has a small gate capacitance value.

Referring to FIG. 8, when a value of gate capacitance Cox decreases according to a change in thickness of the gate insulating layer, it can be seen that a range of a gate voltage DR $V_{GS}$ (see FIG. 8) for having a driving current DR Ids in a specific range (see FIG. 8) becomes wider. For example, in the driving transistor DT, even when the first active layer 350 is made of an oxide semiconductor, when the thickness of the gate insulating layer increases, the value of the gate capacitance Cox may decrease, and the driving voltage DR $V_{GS}$ in a wide range may be secured.

In the display device 1 according to an exemplary embodiment, one or more layers may be between the first gate electrode 310 and the first active layer 350 of the driving transistor DT. The number or thicknesses of the layers may be adjusted to reduce the value of the gate capacitance Cox between the first gate electrode 310 and the first active layer 350, and thus, the driving transistor DT may have a driving voltage in a wide range.

As illustrated in FIG. 7, a plurality of layers, for example, the first interlayer insulating layer 150, the second gate insulating layer 133, and the third gate insulating layer 135 may be between the first gate electrode 310 and the first active layer 350 of the driving transistor DT. In the driving transistor DT, the first gate electrode 310 and the first active layer 350 may be spaced apart from each other by a first distance WC1, and first gate capacitance Cox1 may be formed therebetween.

The first gate insulating layer 131 may be between the second gate electrode 410 and the second active layer 450 of the first switching transistor ST1, and the second gate electrode 410 and the second active layer 450 may be spaced apart from each other by a second distance WC2 corresponding to a thickness of the first gate insulating layer 131.

The second gate insulating layer 133 may be between the third gate electrode 510 and the third active layer 550 of the second switching transistor ST2, and the third gate electrode 510 and the third active layer 550 may be spaced apart from each other by a third distance WC3 corresponding to a thickness of the second gate insulating layer 133. In addition, second gate capacitance Cox2 may be formed therebetween.

In the display device 1 according to an exemplary embodiment, the first distance WC1, which is a distance between the first gate electrode 310 and the first active layer 350 of the driving transistor DT, may be greater than the second distance WC2, which is a distance between the second gate electrode 410 and the second active layer 450 of the first switching transistor ST1, and the third distance WC3, which is a distance between the third gate electrode 510 and the third active layer 550 of the second switching transistor ST2. The driving transistor DT requires element characteristics having a driving voltage in a wide range. As described above, as the value of the gate capacitance Cox formed in the gate insulating layer between the gate electrode and the active layer decreases, the driving transistor DT may have a driving voltage in a wide range. Accordingly, in the driving transistor DT of the display device 1, the distance between the first gate electrode 310 and the first active layer 350 may be greater than that of other switching transistors, for example, the first switching transistor ST1 and the second switching transistor ST2.

In a transistor of which an active layer is made of an oxide semiconductor, a length of a channel region required for having a driving voltage in a specific range may be greater than that of a transistor of which an active layer is made of polysilicon. However, in the display device 1 according to an exemplary embodiment, a plurality of layers, for example, the second gate insulating layer 133 and the third gate insulating layer 135 may be positioned between the gate electrode and the active layer of the driving transistor DT, and the driving transistor DT may have a driving voltage in a wide range. For example, in the driving transistor DT, the distance between the gate electrode and the active layer may be greater than the distance between the gate electrode and the active layer of the first switching transistor ST1 of which the active layer is made of polysilicon.

In some exemplary embodiments, the driving transistor DT and the first switching transistor ST1 may include the channel regions having the same width. Referring to a distance between a gate electrode and an active layer, the first distance WC1 of the driving transistor DT may be in a range of 2 times to 4 times, or 2.5 times to 3 times, the second distance WC2 of the first switching transistor ST1. For example, when the second distance WC2 of the first switching transistor ST1 has a value of about 1,400 Å, the first distance WC1 of the driving transistor DT may be in a range of 3,500 Å to 4,200 Å. However, the present disclosure is not limited thereto.

In some embodiments, in the driving transistor DT, the distance between the gate electrode and the active layer may be greater than that of the second switching transistor ST2. In an example, unlike the second switching transistor ST2, in the driving transistor DT, because the third gate insulating layer 135 and/or the first interlayer insulating layer 150 is further positioned between the first gate electrode 310 and the first active layer 350, the first distance WC1, which is the distance between the gate electrode and the active layer, may be greater than the third distance WC3 of the second switching transistor ST2.

In the second switching transistor ST2, of which the active layer is made of an oxide semiconductor, a breakdown voltage BV has a value greater than that of the first switching transistor ST1, of which the active layer is made of polysilicon. In a switching transistor, a value of a gate-on voltage $V_{GL}$ increases as compared with a gate-off voltage $V_{GH}$. In this case, it may be difficult for the second switching transistor ST2 including the active layer made of an oxide semiconductor to secure element characteristics required as a switching transistor.

Figure 9:
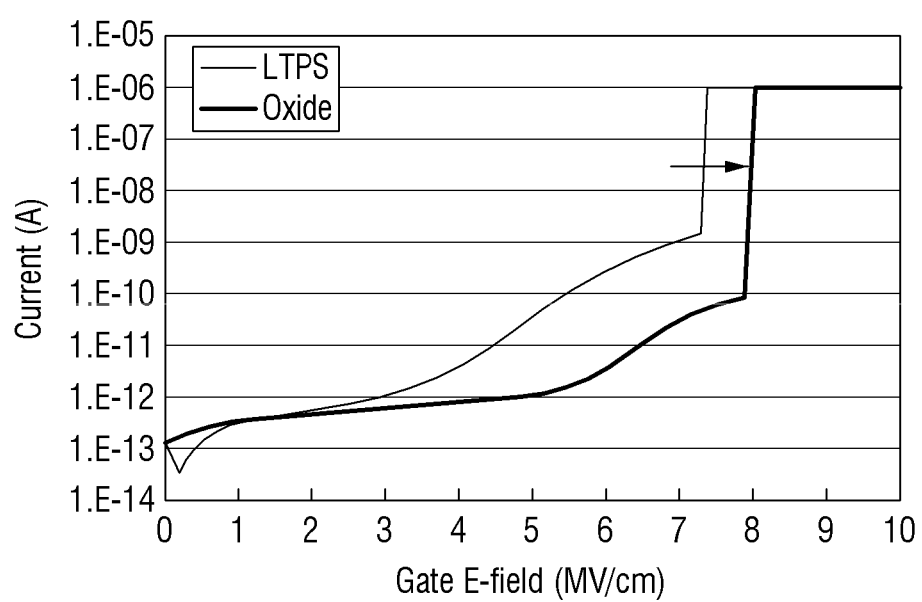
FIG. 9 is a graph showing changes in gate E-field and driving current (A) according to types (or kinds) of an active layer of a transistor.

FIG. 9 is a graph showing changes in gate E-field and driving current (A) of a gate electrode according to types (or kinds) of an active layer of a transistor.

FIG. 9 shows a change in driving current (A) according to a change in gate E-field of a transistor including an active layer made of polysilicon (LTPS of FIG. 9) and a transistor including an active layer made of an oxide semiconductor (Oxide of FIG. 9). Referring to FIG. 9, in the transistor including the active layer made of an oxide semiconductor (Oxide), a breakdown voltage BV, which corresponds to a section in which a graph is abruptly changed (see arrow in FIG. 9), has a value greater than that of the transistor including the active layer made of polysilicon (LTPS). Accordingly, in a transistor, a value of a gate-on voltage $V_{GL}$ increases as compared with a gate-off voltage $V_{GH}$.

However, even when the active layer of the transistor is made of an oxide semiconductor, when a thickness of the gate insulating layer decreases, the value of the gate-on voltage $V_{GL}$ may be reduced as compared with the gate-off voltage $V_{GH}$, and the transistor may secure element characteristics as a switching transistor.

In this respect, the display device 1 according to an exemplary embodiment may have the second switching transistor ST2, in which the distance between the gate electrode and the active layer may be smaller than that of the first switching transistor ST1. For example, the third distance WC3 of the second switching transistor ST2 may be smaller than the second distance WC2 of the first switching transistor ST1. As illustrated in FIG. 7, the distance between the gate electrode and the active layer of the first switching transistor ST1, or the thickness of the first gate insulating layer 131, may be greater than the distance between the gate electrode and the active layer of the second switching transistor ST2, or the thickness of the second gate insulating layer 133.

In some exemplary embodiments, referring to a distance between a gate electrode and an active layer, the third distance WC3 of the second switching transistor ST2 may be in a range of 0.5 times to 0.75 times the second distance WC2 of the first switching transistor ST1. For example, when the second distance WC2 of the first switching transistor ST1 has a value of about 1,250 Å, the third distance WC3 of the second switching transistor ST2 may have a value of about 850 Å. Even when the active layer is made of an oxide semiconductor, the second switching transistor ST2 may secure at least the same element characteristics as the first switching transistor ST1.

As a result, the display device 1 may include transistors including different active layers, for example, the driving transistor DT, the first switching transistor ST1, and the second switching transistor ST2, and the distances between the gate electrode and the active layer thereof may be different. Accordingly, even when the driving transistor DT and the second switching transistor ST2 each include the active layer made of an oxide semiconductor, excellent (or suitable) element characteristics may be secured even without an increase in length of the channel region.

In some embodiments, in the driving transistor DT and the second switching transistor ST2, the distance between the gate electrode and the active layer may be changed according to layers (levels) on which the driving transistor DT and the second switching transistor ST2 are positioned, or changed according to the arrangement of the second gate insulating layer 133 and the third gate insulating layer 135. Because the driving transistor DT, the first switching transistor ST1, and the second switching transistor ST2 are positioned on different layers (levels), the gate electrodes and the active layers thereof may be formed through different processes.

For example, as illustrated in FIG. 7, the first interlayer insulating layer 150, the second gate insulating layer 133, and the third gate insulating layer 135 may be between the first gate electrode 310 and the first active layer 350 of the driving transistor DT. The second gate insulating layer 133 may be between the third gate electrode 510 and the third active layer 550 of the second switching transistor ST2. In the drawing (e.g., FIG. 7), the third gate insulating layer 135 is illustrated as not being on the third gate electrode 510 of the second switching transistor ST2, and is illustrated as being only in a partial region on the second gate insulating layer 133. In some embodiments, the third gate insulating layer 135 may be only in a region overlapping the first active layer 350. In this case, desired element characteristics may be secured by adjusting a thickness of the third gate insulating layer 135 by the driving transistor DT and adjusting the thickness of the second gate insulating layer 133 by the second switching transistor ST2. However, the present disclosure is not limited thereto.

According to some exemplary embodiments, the arrangement of the second gate insulating layer 133 and the third gate insulating layer 135 may be changed, or the arrangement of the first gate electrode 310, the third gate electrode 510, the first active layer 350, and the third active layer 550 may be changed. This will be described in more detail below with reference to other exemplary embodiments.

Referring again to FIGS. 4 to 7, the second interlayer insulating layer 170 may be on the third gate conductive layer and the third semiconductor layer. For example, the second interlayer insulating layer 170 may be formed so as to cover entire surfaces of the second gate insulating layer 133 and the third gate insulating layer 135, including the third gate electrode 510 of the second switching transistor ST2 and the first active layer 350 of the driving transistor DT. A plurality of contact holes passing through the second interlayer insulating layer 170 may be formed in the second interlayer insulating layer 170, and thus, the first data conductive layers, which will be described below in more detail, may be in contact with different active layers 350, 450, and 550.

The first interlayer insulating layer 150 may be made of, for example, an inorganic material such as $SiO_x$, $SiN_x$, or a combination or a stacked structure thereof.

The first data conductive layer may be on the second interlayer insulating layer 170. The first data conductive layer may include the source/drain electrodes 330 and 340 of the driving transistor DT, the source/drain electrodes 430 and 440 of the first switching transistor ST1, and the source/drain electrodes 530 and 540 of the second switching transistor ST2.

A first source/drain electrode 330 of the driving transistor DT may be in contact with the first conductive region 350a of the first active layer 350 through a first contact hole CT1 passing through the second interlayer insulating layer 170 to partially expose an upper surface of the first active layer 350. A second source/drain electrode 340 of the driving transistor DT may be in contact with the second conductive region 350b of the first active layer 350 through a second contact hole CT2 passing through the second interlayer insulating layer 170 to partially expose the upper surface of the first active layer 350. The second source/drain electrode 340 of the driving transistor DT may be in contact with a conductive pattern 620 of the second data conductive layer which will be described below in more detail. As a result, the second source/drain electrode 340 may be electrically connected to a first electrode AE of the light-emitting element EL.

A first source/drain electrode 430 of the first switching transistor ST1 may be in contact with the first doped region 450a of the second active layer 450 through a third contact hole CT3 passing through the second interlayer insulating layer 170, the second gate insulating layer 133, the first interlayer insulating layer 150, the first protective layer 140, and the first gate insulating layer 131 to partially expose an upper surface of the second active layer 450. A second source/drain electrode 440 of the first switching transistor ST1 may be in contact with the second doped region 450b of the second active layer 450 through a fourth contact hole CT4 passing through the second interlayer insulating layer 170, the second gate insulating layer 133, the first interlayer insulating layer 150, the first protective layer 140, and the first gate insulating layer 131 to partially expose the upper surface of the second active layer 450.

A first source/drain electrode 530 of the second switching transistor ST2 may be in contact with the third conductive region 550a of the third active layer 550 through a fifth contact hole CT5 passing through the second interlayer insulating layer 170 and the second gate insulating layer 133 to partially expose an upper surface of the third active layer 550. A second source/drain electrode 540 of the second switching transistor ST2 may be in contact with the fourth conductive region 550b of the third active layer 550 through a sixth contact hole CT6 passing through the second interlayer insulating layer 170 and the second gate insulating layer 133 to partially expose the upper surface of the third active layer 550.

The first data conductive layer may be formed as a single layer or a multi-layer that is made of one selected from molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The second protective layer 180 may be on the first data conductive layer. The second protective layer 180 may be on an entire surface of the second interlayer insulating layer 170, including the source/drain electrodes of the first data conductive layer. Because descriptions of the second protective layer 180 are substantially the same as descriptions of the first protective layer 140, duplicative descriptions thereof will not be provided.

The second data conductive layer may be on the second protective layer 180. The second data conductive layer may include the conductive pattern 620. However, the present disclosure is not limited thereto, and the second data conductive layer may further include the first voltage line VDDL to which the first voltage VDD is applied, the second voltage line VSSL to which the second voltage VSS is applied, and/or the initialization voltage line Vint to which the initialization voltage is applied.

The conductive pattern 620 may be in contact with the second source/drain electrode 340 of the driving transistor DT through a contact hole passing through the second protective layer 180 to partially expose an upper surface of the second source/drain electrode 340 of the driving transistor DT. The second source/drain electrode 340 of the driving transistor DT may be connected to one electrode of another switching transistor, for example, the fifth switching transistor ST5 or the sixth switching transistor ST6, through the conductive pattern 620. In some embodiments, the second data conductive layer may include a larger number of conductive patterns, and thus, the source/drain electrodes of the driving transistor DT, the first switching transistor ST1, and the second switching transistor ST2 may be connected to another switching transistor, the first voltage line VDDl, and/or the initialization voltage line Vint.

The second data conductive layer may be formed as a single layer or a multi-layer that is made of one selected from molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The first planarizing film 190 may be on the second data conductive layer and the second protective layer 180. The first planarizing film 190 may planarize a stepped portion caused by thin-film transistors such as the driving transistor DT, the first switching transistor ST1, and/or the second switching transistor ST2. The first planarizing film 190 may be formed of an organic film made of an acryl resin, an epoxy resin, a phenolic resin, a polyamide resin, a polyimide resin, and/or the like.

While the first planarizing film 190 is illustrated as being directly on the second data conductive layer, the present disclosure is not limited thereto. Another protective layer may be further positioned between the first planarizing film 190 and the second protective layer 180, and/or between the first planarizing film 190 and the second data conductive layer.

A pixel definition film 195 and the light-emitting element EL that includes the first electrode AE, the organic light-emitting layer OL, and a second electrode CE may be formed on the first planarizing film 190.

The first electrode AE may be formed on the first planarizing film 190. The first electrode AE may be a pixel electrode that is formed for every pixel PX. The first electrode AE may be in contact with the second data conductive layer exposed through a contact hole that passes through the first planarizing film 190, and thus, the first electrode AE may be connected to source/drain electrodes of another switching transistor.

In order to partition pixels, the pixel definition film 195 may be formed on the first planarizing film 190 so as to cover an edge of the first electrode AE. For example, the pixel definition film 195 may serve as a pixel definition film that defines the pixels. Here, each of the pixels represents a region in which the first electrode AE, the organic light-emitting layer OL, and the second electrode CE are sequentially stacked so that holes from the first electrode AE and electrons from the second electrode CE are combined with each other in the organic light-emitting layer OL to emit light.

The organic light-emitting layer OL may be on the first electrode AE and the pixel definition film 195. The organic light-emitting layer OL may include a hole transporting layer, a light-emitting layer, and an electron transporting layer. In some embodiments, the organic light-emitting layer OL may be formed in a tandem structure of two or more stacks, and in this case, a charge generation layer may be formed between the stacks. In the drawing (e.g., FIG. 7), the organic light-emitting layer OL is illustrated as being formed only in a partial region corresponding to the first electrode AE, but the present disclosure is not limited thereto. In some exemplary embodiments, the organic light-emitting layer OL may be formed over an entire surface of the display area DA.

The second electrode CE may be formed on the organic light-emitting layer OL. The second electrode CE may be a common electrode commonly formed in the pixels PX.

The light-emitting elements EL may be formed in a top emission manner, in which light is emitted in an upward direction. In this case, the first electrode AE may be made of a metal material that has high reflectivity, and for example, may have a stacked structure of aluminum and titanium (Ti/Al/Ti), a stacked structure of aluminum and indium tin oxide (ITO) (ITO/Al/ITO), a silver-palladium-copper (APC) alloy, and a stacked structure of an APC alloy and ITO (ITO/APC/ITO). The APC alloy is an alloy of silver (Ag), palladium (Pd), and copper (Cu). In some embodiments, the second electrode CE may be made of a transparent conductive material (TCO) that is capable of transmitting light, such as ITO and/or indium zinc oxide (IZO), or may be made of a semi-transmissive conductive material such as magnesium (Mg), silver (Ag), or an alloy of Mg and Ag. When the second electrode CE is made of the semi-transmissive conductive material, light extraction efficiency may be improved due to a microcavity.

An encapsulation layer TFE configured to prevent or reduce oxygen and/or moisture from penetrating may be formed on the second electrode CE. The encapsulation layer TFE may include at least one inorganic film. The inorganic film may be made of silicon nitride, aluminum nitride, zirconium nitride, titanium nitride, hafnium nitride, tantalum nitride, silicon oxide, aluminum oxide, and/or titanium oxide. In some embodiments, the encapsulation layer TFE may include at least one organic film to prevent or reduce particles from penetrating the encapsulation layer TFE and being introduced into the organic light-emitting layer OL and the second electrode CE. The organic film may be made of an epoxy, an acrylate, and/or a urethane acrylate.

In the display device 1 according to an exemplary embodiment, the driving transistor DT, the first switching transistor ST1, and the second switching transistor ST2 may be positioned on different layers (levels), and the active layers thereof may be different from each other. However, even when the active layers include different materials, the driving transistor DT, the first switching transistor ST1, and the second switching transistor ST2 may secure desirable element characteristics (as a driving transistor or a switching transistor) by adjusting a distance between the gate electrode and the active layer thereof. Accordingly, the display device 1 according to an exemplary embodiment may include a large number of the pixels PX even in a relatively small area and thus have high resolution display quality.

Hereinafter, various exemplary embodiments of the display device 1 will be described with reference to other drawings.

As described above, the structure and arrangement relationship of the plurality of semiconductor layers, the conductive layers, and the third gate insulating layer 135 of the display device 1 may be variously modified.

FIGS. 10 to 16 are cross-sectional views illustrating a portion of a display device according to other exemplary embodiments.

Figure 10:
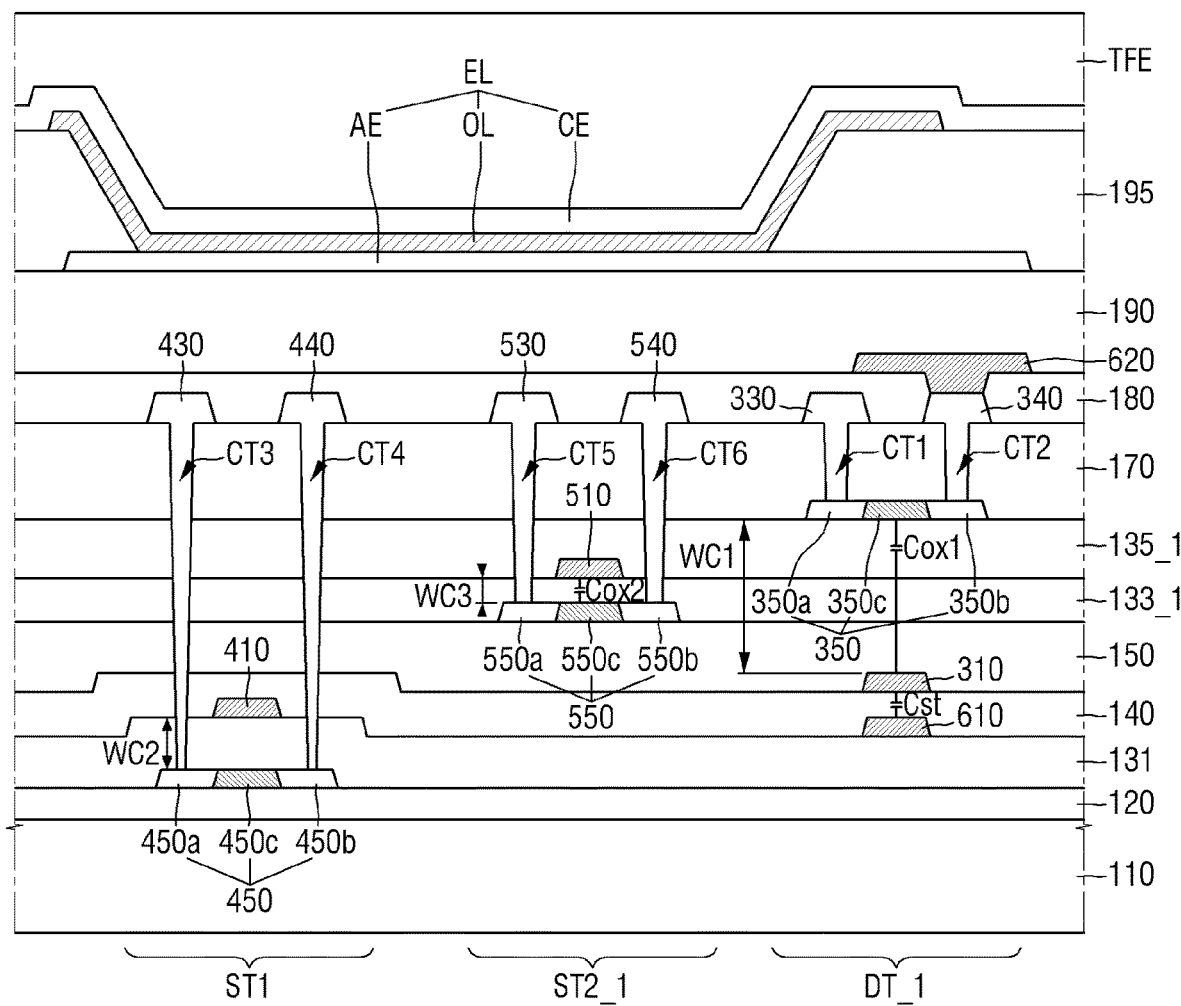
FIGS. 10-16 are cross-sectional views illustrating a portion of a display device according to exemplary embodiments.

First, referring to FIG. 10, in a display device according to an exemplary embodiment, a first interlayer insulating layer 150, a second gate insulating layer 133_1, and a third gate insulating layer 135_1 may be positioned between a first gate electrode 310 and a first active layer 350 of a driving transistor DT_1, and the third gate insulating layer 135_1 may be on an entire surface of the second gate insulating layer 133_1. The present exemplary embodiment is different from the exemplary embodiment of FIG. 7 in that the third gate insulating layer 135_1 is disposed on the entire surface of the second gate insulating layer 133_1. Hereinafter, redundant descriptions will not be provided, and the following descriptions will be based on differences from the above-described contents.

In the exemplary embodiment of FIG. 10, a third gate electrode 510 may be on the second gate insulating layer 133_1 as a third gate conductive layer, and the third gate insulating layer 135_1 may be positioned so as to cover the entire surface of the second gate insulating layer 133_1 including the third gate electrode 510. Therefore, according to an exemplary embodiment, the third gate electrode 510 may be in direct contact with the third gate insulating layer 135_1. In this case, a third distance WC3 between a gate electrode and an active layer of a second switching transistor ST2_1 may be substantially the same as a thickness of the second gate insulating layer 133_1, and a first distance WC1 between the gate electrode and the active layer of the driving transistor DT_1 may be greater than at least the sum of thicknesses of the second gate insulating layer 133_1 and the third gate insulating layer 135_1. The display device according to an exemplary embodiment may include the third gate insulating layer 135_1 so that element characteristics of the driving transistor DT_1 may be secured.

Next, referring to FIG. 11, in a display device according to an exemplary embodiment, a second gate insulating layer 133_2 and a third gate insulating layer 135_2 may be between a first gate electrode 310 and a first active layer 350 of a driving transistor DT_2, and the third gate insulating layer 135_2 may be below the second gate insulating layer 133_2. That is, the third gate insulating layer 135_2 may be between the second gate insulating layer 133_2 and a first interlayer insulating layer 150. The present exemplary embodiment is different from the exemplary embodiment of FIG. 7 in that the arrangement of the second gate insulating layer 133_2 is different. Hereinafter, redundant descriptions will not be provided, and the following descriptions will be based on differences from the above-described contents.

Figure 11:
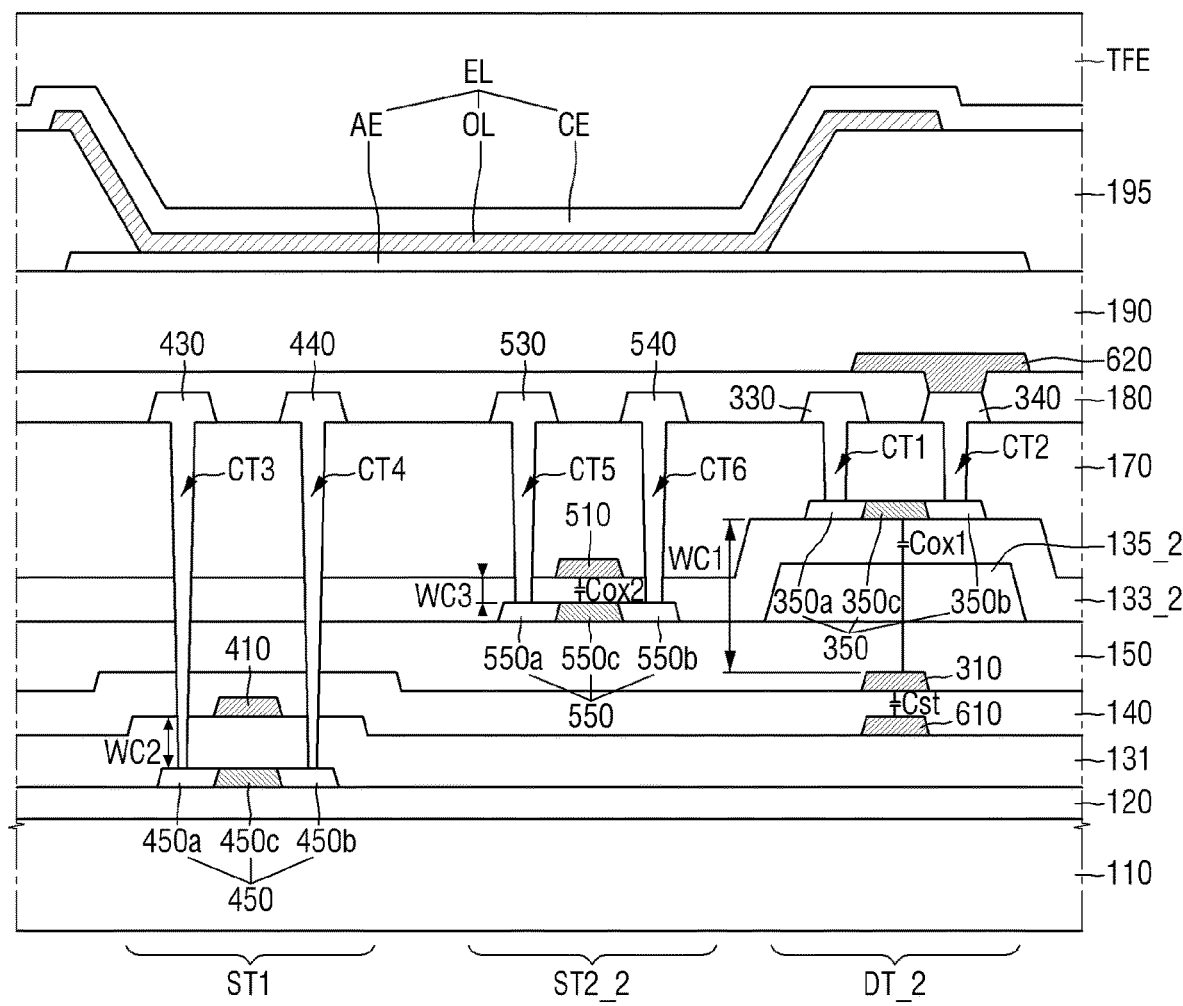

As in the exemplary embodiment of FIG. 7, in the exemplary embodiment of FIG. 11, the third gate insulating layer 135_2 may be positioned only in a region overlapping the first active layer 350, and the first interlayer insulating layer 150, the second gate insulating layer 133_2, and the third gate insulating layer 135_2 may be between the first gate electrode 310 and the first active layer 350 of the driving transistor DT_2. However, in the present exemplary embodiment, the third gate insulating layer 135_2 may be between the second gate insulating layer 133_2 and the first interlayer insulating layer 150, below the second gate insulating layer 133_2. The third gate insulating layer 135_2 may be in direct contact with the first interlayer insulating layer 150 and the second gate insulating layer 133_2. As illustrated in the drawing (FIG. 11), a lower surface of the third gate insulating layer 135_2 may be in direct contact with the first interlayer insulating layer 150, and side surfaces and an upper surface thereof may be in direct contact with a lower surface of the second gate insulating layer 133_2.

In some embodiments, the first active layer 350 of the driving transistor DT_2 and a third active layer 550 of a second switching transistor ST2_2 may be on the same semiconductor layer. In this case, the first interlayer insulating layer 150 may not be present between the first active layer 350 and the first gate electrode 310 of the driving transistor DT_2.

Figure 12:
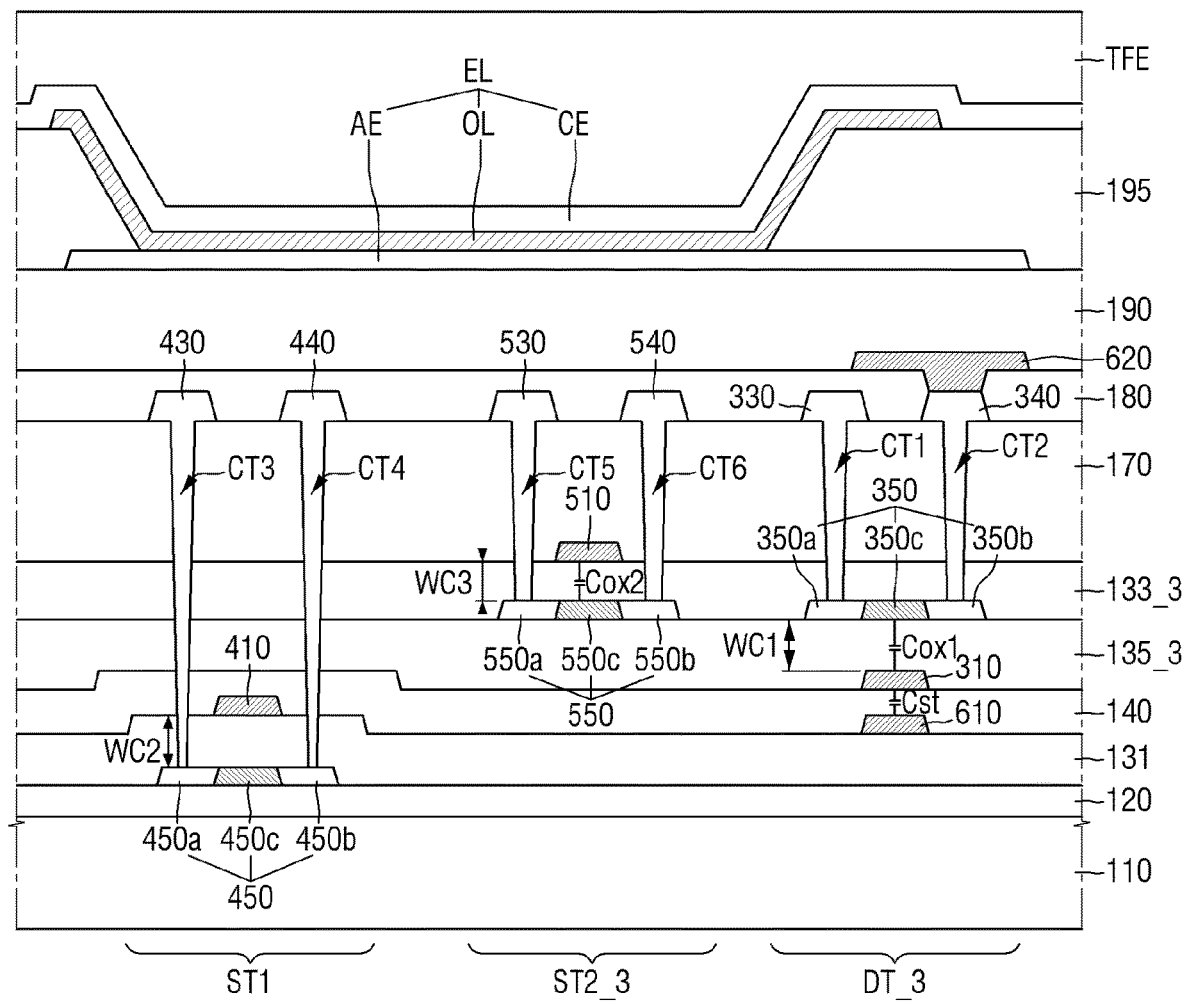

Referring to FIG. 12, in a display device according to an exemplary embodiment, a first active layer 350 of a driving transistor DT_3 and a third active layer 550 of a second switching transistor ST2_3 may be on the same layer (level), and may each be positioned on a third gate insulating layer 135_3. That is, the third gate insulating layer 135_3 may be directly on a first protective layer 140 and a first gate electrode 310, and the first active layer 350 and the third active layer 550 may be on the third gate insulating layer 135_3. In this case, a first interlayer insulating layer 150 may be omitted, and only the third gate insulating layer 135_3 may be positioned between the first active layer 350 and the first gate electrode 310, so that the third gate insulating layer 135_3 may be in direct contact with the first protective layer 140 and the first gate electrode 310.

Accordingly, in an exemplary embodiment, a first distance WC1 between the gate electrode and the active layer of the driving transistor DT_3 may be substantially the same as a thickness of the third gate insulating layer 135_3. The driving transistor DT_3 may secure a desired range of a driving voltage by adjusting the thickness of the third gate insulating layer 135_3.

In some embodiments, a second gate insulating layer 133_3 may be positioned so as to cover an upper surface of the third gate insulating layer 135_3, including being on the first active layer 350 and the third active layer 550. A third distance WC3 between a gate electrode and the active layer of the second switching transistor ST2_3 may be the same as a thickness of the second gate insulating layer 133_3. In this case, the thickness of the second gate insulating layer 133_3 may be smaller than the thickness of the third gate insulating layer 135_3.

Figure 13:
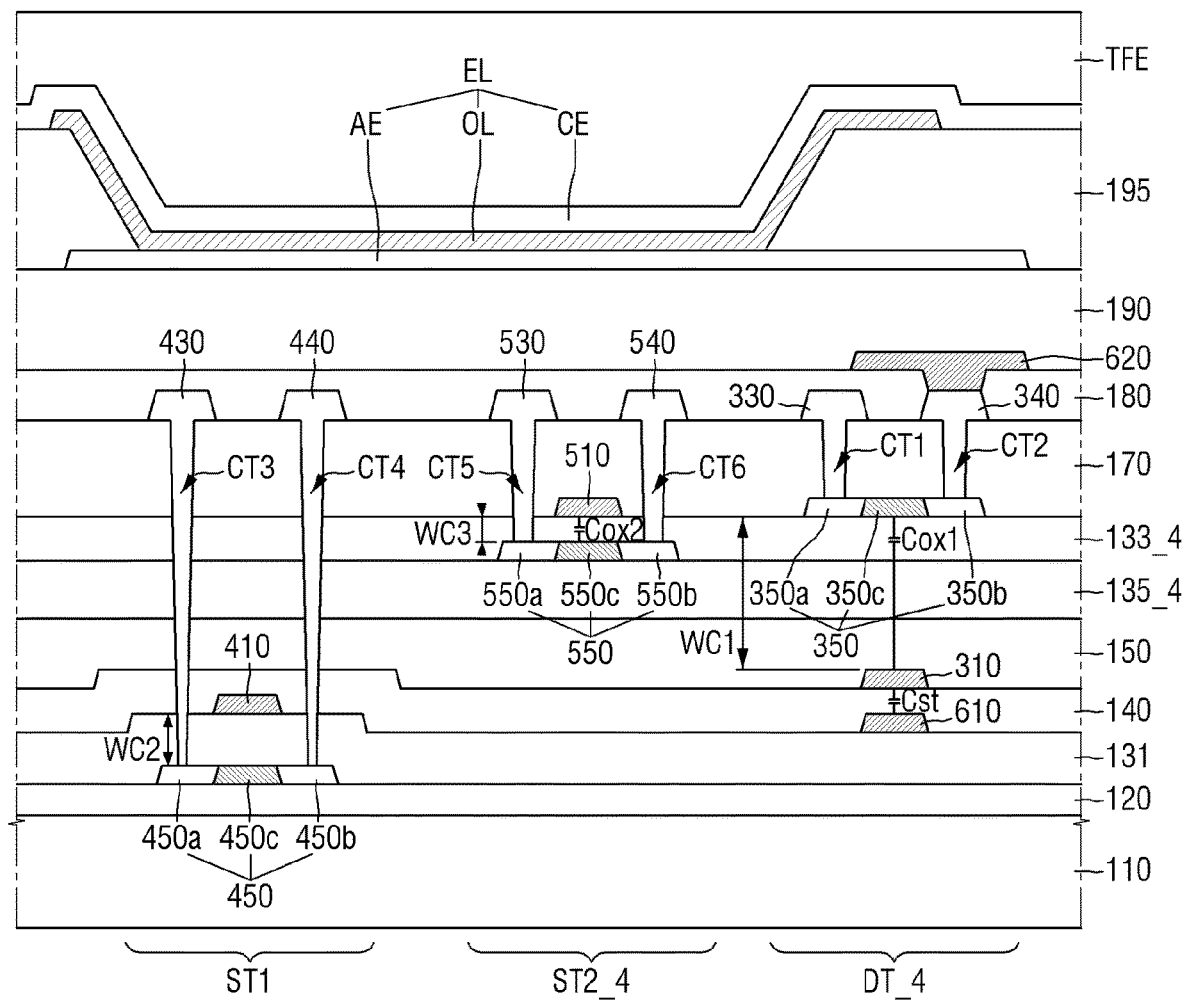

Next, referring to FIG. 13, in a display device 1 according to an exemplary embodiment, a third active layer 550 may be on a third gate insulating layer 135_4, a second gate insulating layer 133_4 may be on the third active layer 550, and a first active layer 350 may be on the second gate insulating layer 133_4. The present exemplary embodiment is different from the exemplary embodiment of FIG. 11 in that the third gate insulating layer 135_4 is positioned on an entire surface of a first interlayer insulating layer 150, and the third active layer 550 of a second switching transistor ST2_4 is on the third gate insulating layer 135_4. When the third gate insulating layer 135_4 is positioned on the entire surface of the first interlayer insulating layer 150, a patterning process during the manufacturing the display device may be omitted. Other redundant descriptions will not be provided.

When there is a process limitation in that a plurality of gate insulating layers have a thickness greater than or equal to a predetermined (or set) level, a larger number of layers may be positioned between a gate electrode and an active layer of a driving transistor DT_4. In some exemplary embodiments, an insulating pattern may be further placed between a first gate electrode 310 and the first active layer 350 of the driving transistor DT_4.

Figure 14:
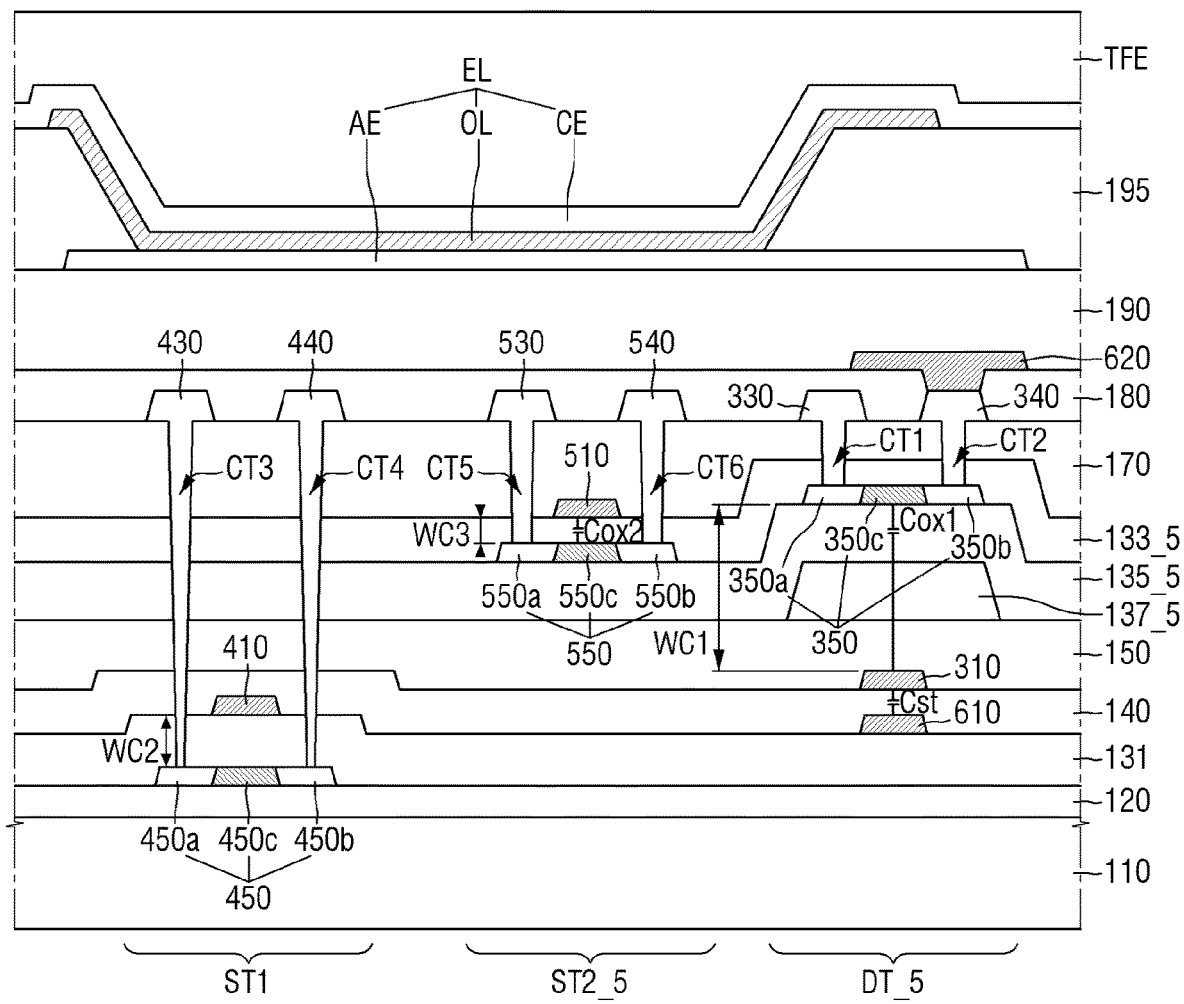

Referring to FIG. 14, a display device according to an exemplary embodiment may further include an insulating pattern 137_5 between a first gate electrode 310 and a first active layer 350 of a driving transistor DT_5. The exemplary embodiment of FIG. 14 is different from the exemplary embodiment of FIG. 13 in that the insulating pattern 137_5 is further provided.

The insulating pattern 137_5 may be positioned in at least a region overlapping the first active layer 350 of the driving transistor DT_5 in a thickness direction thereof. As illustrated in the drawing (FIG. 14), the insulating pattern 137_5 may be on a first interlayer insulating layer 150 and may be positioned only in a region overlapping the first active layer 350. However, the present disclosure is not limited thereto, and the insulating pattern 137_5 may be on an entire surface of the first interlayer insulating layer 150. When there is a process limitation in adjusting a thickness of a specific insulating layer during the manufacturing the display device, another insulating layer or the insulating pattern 137_5 may be positioned to control a first distance WC1 between the gate electrode and the active layer of the driving transistor DT_5.

In the drawing (FIG. 14), the insulating pattern 137_5 is illustrated as being between a third gate insulating layer 135_5 and the first interlayer insulating layer 150 to be in direct contact with each of the third gate insulating layer 135_5 and the first interlayer insulating layer 150. For example, in an exemplary embodiment, a lower surface of the insulating pattern 137_5 may be in direct contact with the first interlayer insulating layer 150, and an upper surface and side surfaces thereof may be in direct contact with a lower surface of the third gate insulating layer 135_5. However, the present disclosure is not limited thereto, and a layer on which the insulating pattern 137_5 is positioned may be variously suitably modified to become a layer between a second gate insulating layer 133_5 and the third gate insulating layer 135_5, or a layer between the first active layer 350 and the second gate insulating layer 133_5.

In some embodiments, the first gate electrode 310 of the driving transistor DT_5 may be positioned opposite to one electrode 610 of a first capacitor Cst below the first gate electrode 310. The one electrode 610 of the first capacitor Cst may be on a first gate insulating layer 131 and may overlap the first gate electrode 310, with a first protective layer 140 interposed therebetween. However, the present disclosure is not limited thereto, and the one electrode 610 of the first capacitor Cst may be on the same layer (level) as a first semiconductor layer, and the first gate electrode 310 of the driving transistor DT_5 may also be on the first gate insulating layer 131.

Figure 15:
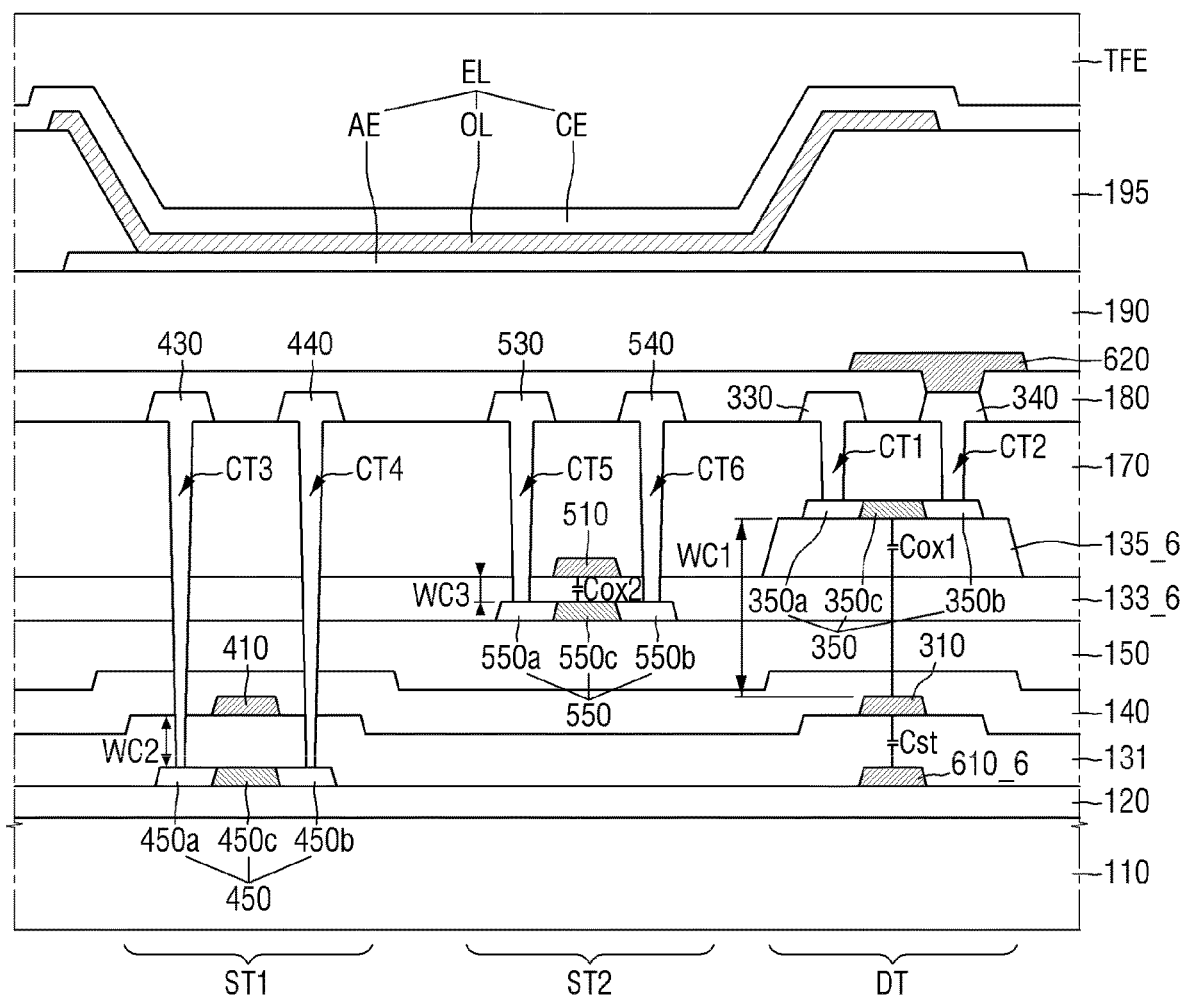

Referring to FIG. 15, in a display device according to an exemplary embodiment, a first semiconductor layer may include a second active layer 450 of a first switching transistor ST1 and one electrode 610_6 of a first capacitor Cst, and a first gate conductive layer may include a second gate electrode 410 and a first gate electrode 310. In this case, a second gate conductive layer may be omitted. The exemplary embodiment of FIG. 15 is different from the exemplary embodiment of FIG. 7 in that the first gate electrode 310 and the one electrode of the first capacitor Cst are positioned on different layers.

In some embodiments, the first semiconductor layer including the second active layer 450 of the first switching transistor ST1 may be made of polysilicon. A partial region of polysilicon may be doped with impurities and thus become conductor. According to an exemplary embodiment, the first semiconductor layer may further include a semiconductor pattern 610_6 (see FIG. 15) overlapping the first gate electrode 310 of a driving transistor DT in a thickness direction thereof, and the semiconductor pattern may be doped with impurities and thus become conductor. The semiconductor pattern, which may overlap the first gate electrode 310 of the driving transistor DT and becomes conductor, may form one electrode 610_6 of the first capacitor Cst. The one electrode 610_6 of the first capacitor Cst may be positioned directly on a buffer layer 120.

The one electrode 610_6 of the first capacitor Cst may be included in the first semiconductor layer, and thus, the first gate electrode 310 of the driving transistor DT may be included in the first gate conductive layer or the second gate conductive layer. As illustrated in FIG. 15, when the first gate electrode 310 is included in the first gate conductive layer and is on a first gate insulating layer 131, the second gate conductive layer may be omitted. In this case, a first protective layer 140 may be further positioned between the first gate electrode 310 and a first active layer 350 of the driving transistor DT. However, the present disclosure is not limited thereto, and the first gate electrode 310 may also be included in the second gate conductive layer and positioned on the first protective layer 140.

In some embodiments, the one electrode 610_6 of the first capacitor Cst may be included in the first semiconductor layer, and concurrently (or at the same time), the first active layer 350 and a third active layer 550 may be in the same semiconductor layer. In this case, a third semiconductor layer may be omitted.

Figure 16:
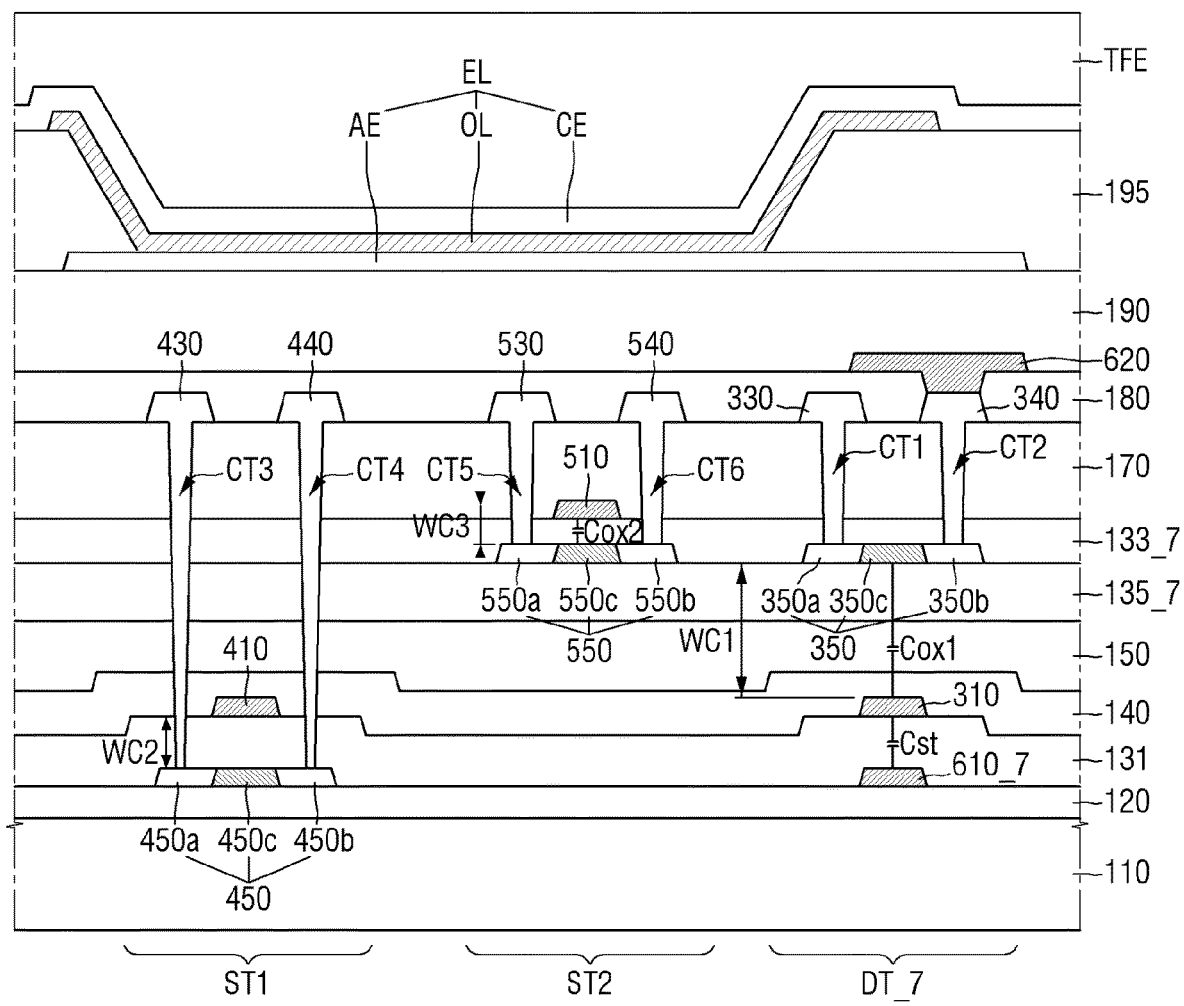

Referring to FIG. 16, in a display device according to an exemplary embodiment, a first active layer 350 and a third active layer 550 may be in the same semiconductor layer, and each of the first active layer 350 and the third active layer 550 may be on a third gate insulating layer 135_7. The present exemplary embodiment is different from the exemplary embodiment of FIG. 15 in that a third semiconductor layer is omitted and a second semiconductor layer includes the first active layer 350 and the third active layer 550. In the present exemplary embodiment, the third gate insulating layer 135_7 may be on a first interlayer insulating layer 150, and each of the first active layer 350 and the third active layer 550 may be on the third gate insulating layer 135_7. A second gate insulating layer 133_7 may be on an entire surface of the third gate insulating layer 135_7, including being on the first active layer 350 and the third active layer 550. Because descriptions thereof are substantially the same as descriptions above, redundant descriptions thereof will not be provided.

In some embodiments, a third gate conductive layer may further include another electrode, in addition to a third gate electrode 510.

Figure 17:
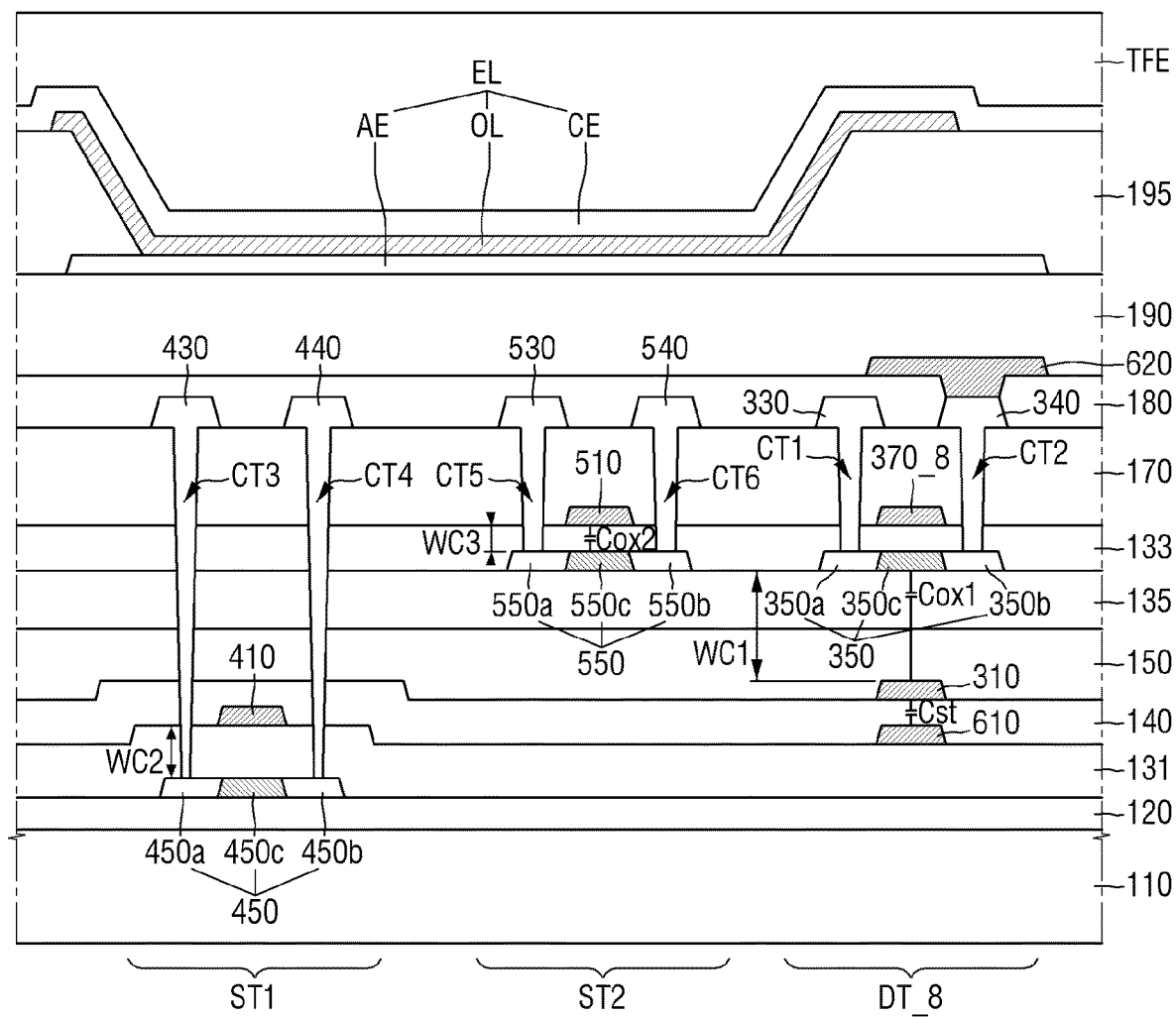
FIG. 17 is a cross-sectional view illustrating a portion of a display device according to another exemplary embodiment.

FIG. 17 is a cross-sectional view illustrating a portion of a display device according to another exemplary embodiment.

Referring to FIG. 17, in a display device according to an exemplary embodiment, a first active layer 350 and a third active layer 550 may be on a third gate insulating layer 135, a second gate insulating layer 133 may be on the first active layer 350 and third active layer 550, and a third gate electrode 510 and a light blocking film 370_8 may be on the second gate insulating layer 133. The light blocking film 370_8 may overlap at least a channel region 350c of the first active layer 350. The light blocking film 370_8 may also perform a function of a light blocking film configured to prevent or reduce light from being incident on the first active layer 350 made of an oxide semiconductor. However, the present disclosure is not limited thereto.

In a driving transistor DT, a first gate electrode 310 is not necessarily below the first active layer 350, and the driving transistor DT may also have a structure reversed therefrom. For example, the driving transistor DT may have a top gate structure, in which the first gate electrode 310 is above the first active layer 350.

Figure 18:
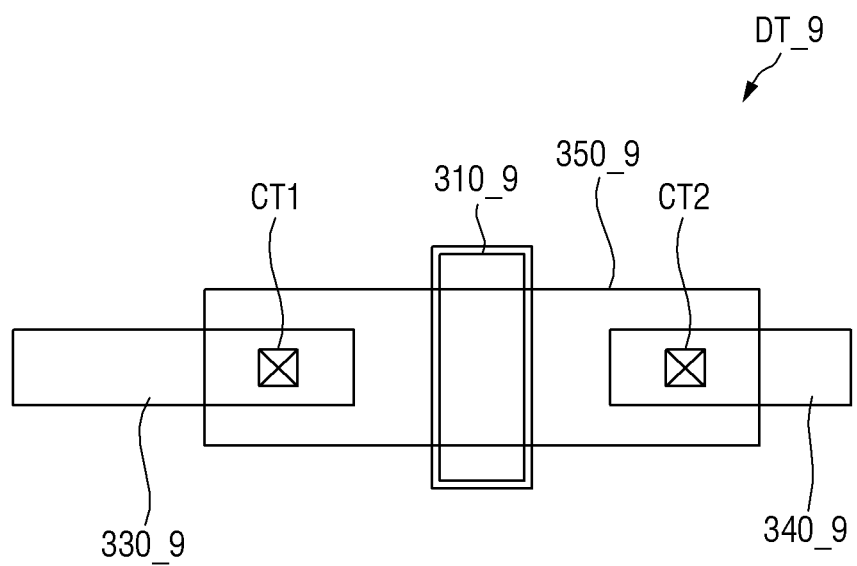
FIG. 18 is a schematic plan view illustrating a driving transistor according to another exemplary embodiment.
Figure 19:
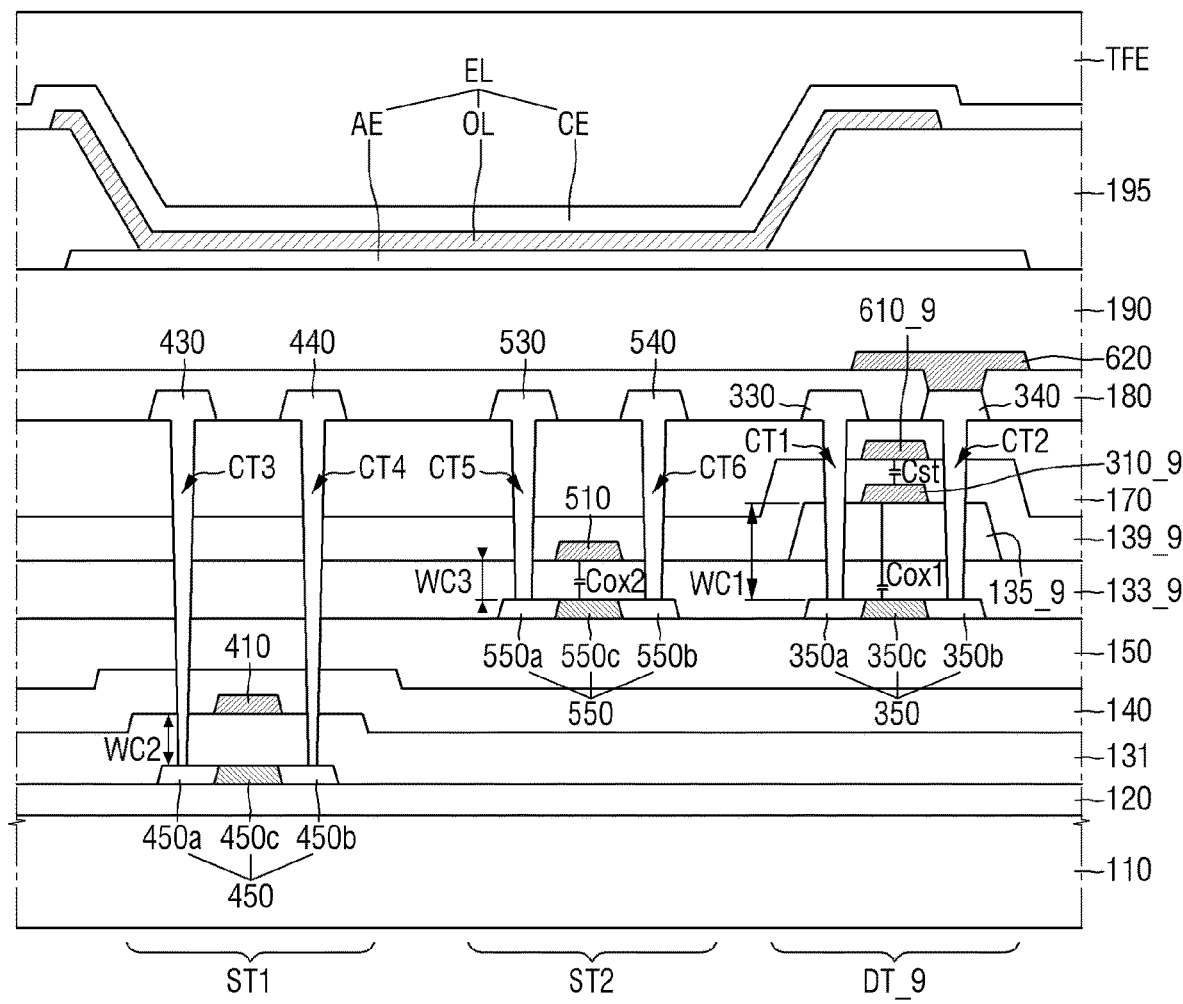
FIG. 19 is a cross-sectional view illustrating a portion of a display device including a driving transistor substantially similar to the transistor of FIG. 18.

FIG. 18 is a schematic plan view illustrating a driving transistor according to another exemplary embodiment. FIG. 19 is a cross-sectional view illustrating a portion of a display device including a driving transistor substantially similar to the transistor of FIG. 18.

Referring to FIGS. 18 and 19, in a display device according to an exemplary embodiment, a first active layer 350 of a driving transistor DT_9 and a third active layer 550 of a second switching transistor ST2 may be on the same layer (level), and a first gate electrode 310_9 may be on the first active layer 350. That is, the driving transistor DT_9 may have a top gate structure.

The first active layer 350 and the third active layer 550 are positioned directly on a first interlayer insulating layer 150, and a second gate insulating layer 133_9 is positioned on an entire surface of the first interlayer insulating layer 150, including being on the first active layer 350 and the third active layer 550. Descriptions thereof are substantially the same as the above descriptions.

A third gate electrode 510 and a third gate insulating layer 135_9 may be on the second gate insulating layer 133_9. The third gate electrode 510 may overlap a channel region 550c of the third active layer 550 with the second gate insulating layer 133_9 interposed therebetween. The third gate insulating layer 135_9 may be only in a region overlapping the first active layer 350 on the second gate insulating layer 133_9. However, the present disclosure is not limited thereto, and the third gate insulating layer 135_9 may be on an entire surface of the second gate insulating layer 133_9. In this case, the third gate electrode 510 may be between the second gate insulating layer 133_9 and the third gate insulating layer 135_9.

The first gate electrode 310_9 of the driving transistor DT_9 may be on the third gate insulating layer 135_9. The first gate electrode 310_9 may overlap a channel region 350c of the first active layer 350 with the second gate insulating layer 133_9 and the third gate insulating layer 135_9 interposed therebetween. Accordingly, the second gate insulating layer 133_9 and the third gate insulating layer 135_9 may be between the first active layer 350 and the first gate electrode 310_9 of the driving transistor DT_9, and the second gate insulating layer 133_9 may be between the third gate electrode 510 and the third active layer 550 of the second switching transistor ST2. A first distance WC1 between the gate electrode and the active layer of the driving transistor DT_9 may be greater than a third distance WC3 between the gate electrode and the active layer of the second switching transistor ST2.

The display device may further include a fourth gate insulating layer 139_9 on the first gate electrode 310_9, the third gate electrode 510, and the third gate insulating layer 135_9. The fourth gate insulating layer 139_9 may be positioned so as to cover the first gate electrode 310_9, the third gate electrode 510, and the third gate insulating layer 135_9, and may be on an entire surface of the second gate insulating layer 133_9.

In the display device according to an exemplary embodiment, because the driving transistor DT_9 has a top gate structure, one electrode 610_9 of a first capacitor Cst may be above the first gate electrode 310_9. The one electrode 610_9 of the first capacitor Cst may be on the fourth gate insulating layer 139_9 and may overlap the first gate electrode 310_9 with the fourth gate insulating layer 139_9 interposed therebetween. The first capacitor Cst may be formed in the fourth gate insulating layer 139_9 between the first gate electrode 310_9 and the one electrode 610_9 of the first capacitor Cst.

Figure 20:
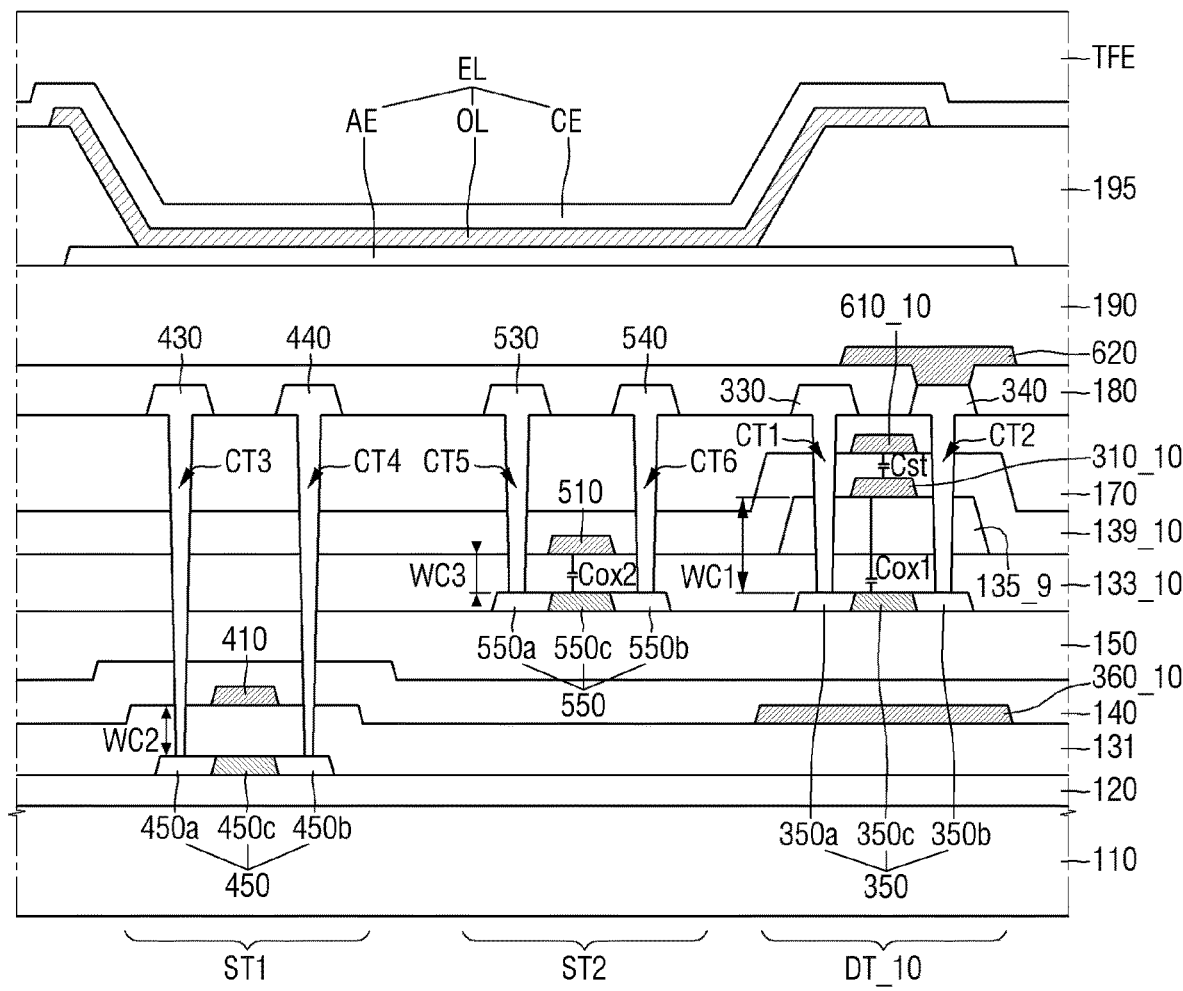
FIG. 20 is a cross-sectional view illustrating a portion of a display device including a driving transistor substantially similar to the transistor of FIG. 18.

FIG. 20 is a cross-sectional view illustrating a portion of a display device including a driving transistor substantially similar to the transistor of FIG. 18.

Referring to FIG. 20, in a display device according to an exemplary embodiment, a first gate conductive layer may further include a light blocking layer 360_10 on a first gate insulating layer 131 and positioned to overlap a first active layer 350 of a driving transistor DT_10. The present exemplary embodiment is different from the exemplary embodiment of FIG. 19 in that the light blocking layer 360_10 is further included. Hereinafter, redundant descriptions will not be provided.

The light blocking layer 360_10 may block (or reduce) light from being incident on the first active layer 350 from a substrate 110, to prevent or reduce a leakage current flowing in the first active layer 350. A width of the light blocking layer 360_10, which is measured in one direction, may be greater than a width of the first active layer 350 which is measured in the one direction. However, the present disclosure is not limited thereto, and the width of the light blocking layer 360_10 may be smaller than the width of the first active layer 350 and may be greater than a width of a channel region 350c of the first active layer 350. The light blocking layer 360_10 may be formed as a single layer or a multi-layer that is made of one selected from molybdenum (Mo), aluminum (Al), chromium (Cr), gold (Au), titanium (Ti), nickel (Ni), neodymium (Nd), and copper (Cu) or an alloy thereof.

In a second switching transistor ST2, a third gate electrode 510 is not necessarily positioned above a third active layer 550, and the second switching transistor ST2 may also have a structure reversed therefrom. That is, the second switching transistor ST2 may have a bottom gate structure in which the third gate electrode 510 is below the third active layer 550.

Figure 21:
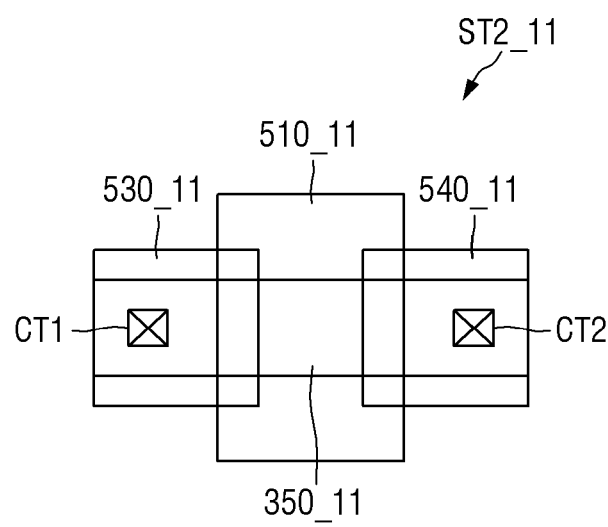
FIG. 21 is a schematic plan view illustrating a second switching transistor according to another exemplary embodiment.
Figure 22:
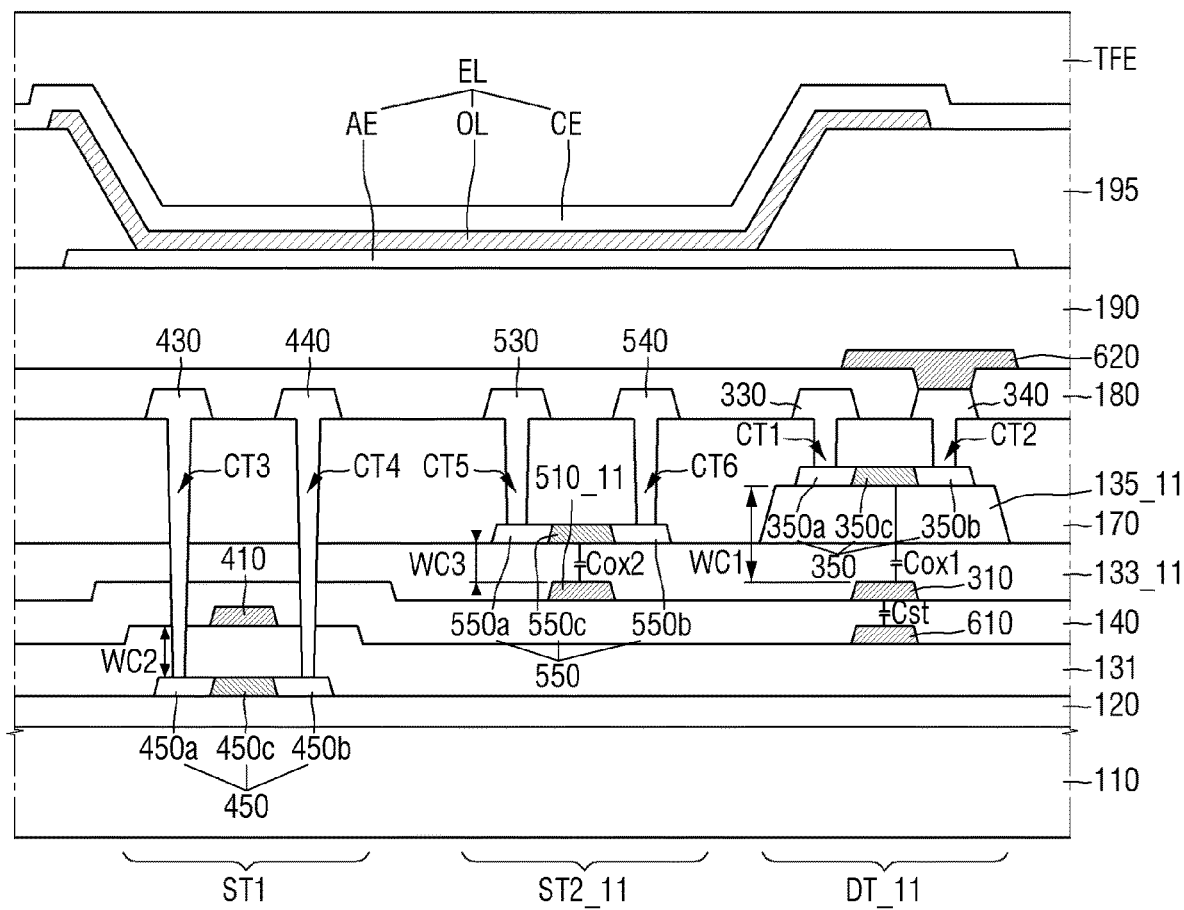
FIG. 22 is a cross-sectional view illustrating a portion of a display device including the second switching transistor of FIG. 21.

FIG. 21 is a schematic plan view illustrating a second switching transistor according to another exemplary embodiment. FIG. 22 is a cross-sectional view illustrating a portion of a display device including the second switching transistor of FIG. 21.

Referring to FIGS. 21 and 22, in a display device according to an exemplary embodiment, a third gate electrode 510_11 of a second switching transistor ST2_11 may be below a third active layer 550. The third gate electrode 510_11 may be on the same layer (level) as a first gate electrode 310 of a driving transistor DT_11, and may be included in a second gate conductive layer.

For example, the third gate electrode 510_11 may be on a first protective layer 140 together with the first gate electrode 310. A second gate insulating layer 133_11 may be on the first gate electrode 310 and the third gate electrode 510_11, and the third active layer 550, a third gate insulating layer 135_11, and a first active layer 350 may be on the second gate insulating layer 133_11. In the present exemplary embodiment, because the second switching transistor ST2_11 has a bottom gate structure, the third gate electrode 510_11 is below the third active layer 550, and the second gate insulating layer 133_11 is positioned therebetween. Accordingly, a first interlayer insulating layer 150 may be omitted. The second gate insulating layer 133_11 and the third gate insulating layer 135_11 may be between the first active layer 350 and the first gate electrode 310 of the driving transistor DT_11.

Figure 23:
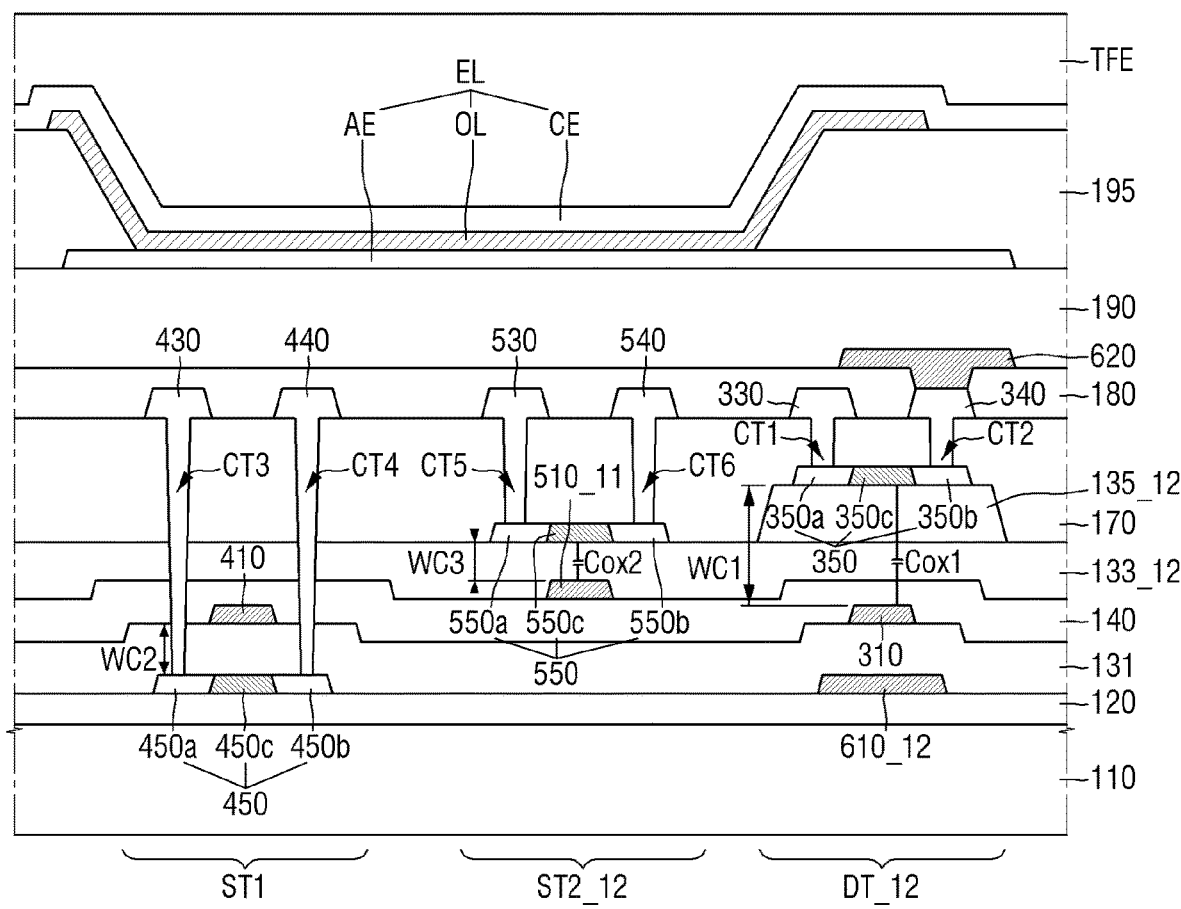
FIG. 23 is a cross-sectional view illustrating a portion of a display device including the second switching transistor of FIG. 21.

FIG. 23 is a cross-sectional view illustrating a portion of a display device including the second switching transistor of FIG. 21.

Referring to FIG. 23, in a display device 1 according to an exemplary embodiment, a third gate electrode 510_11 of a second switching transistor ST2_12 may be below a third active layer 550, a first gate electrode 310 of a driving transistor DT_12 may be on a first gate insulating layer 131, and a first semiconductor layer may include a semiconductor pattern 610_12 on a buffer layer 120. The semiconductor pattern 610_12 on the buffer layer 120 may form one electrode 610_12 of a first capacitor Cst. The present exemplary embodiment is substantially the same as a combination of the exemplary embodiments of FIGS. 15 and 22 described above. Redundant descriptions thereof will not be provided.

A display device according to an exemplary embodiment includes a driving transistor and a switching transistor, which include an oxide semiconductor, and distances between an active layer and a gate electrode of each of the driving transistor and the switching transistor can be different from each other. Gate insulating layers between active layers and gate electrodes of the driving transistor and the switching transistor can have different thicknesses or can include a plurality of layers.

Accordingly, even when the driving transistor and the switching transistor include an oxide semiconductor, the driving transistor and the switching transistor can have excellent (suitable) element characteristics, and the display device can include a larger number of pixels, and thus have high resolution display quality.

Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The device and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present disclosure.

In concluding the detailed description, those skilled in the art will appreciate that many variations and modifications can be made to the example embodiments without substantially departing from the principles of the present disclosure. Therefore, the disclosed embodiments are used in a generic and descriptive sense only and not for purposes of limitation.

What is claimed is:

1. A display device comprising:
a substrate, and, in an upward direction from the substrate:
a buffer layer on the substrate;
a first semiconductor layer on the buffer layer and comprising an active layer of a first switching transistor;
a first gate insulating layer on the first semiconductor layer;
a first gate conductive layer on the first gate insulating layer and comprising a gate electrode of the first switching transistor;
a first protective layer on the first gate conductive layer;
a second gate conductive layer on the first protective layer and comprising a gate electrode of a driving transistor;
a first interlayer insulating layer on the second gate conductive layer;
a second semiconductor layer on the first interlayer insulating layer and comprising an active layer of a second switching transistor;
a second gate insulating layer on the second semiconductor layer;
a third gate conductive layer on the second gate insulating layer and comprising a gate electrode of the second switching transistor;
a third gate insulating layer above the first interlayer insulating layer; and
a third semiconductor layer above the third gate insulating layer and comprising an active layer of the driving transistor,
wherein a distance between the active layer and the gate electrode of the driving transistor is greater than a distance between the active layer and the gate electrode of the second switching transistor.

2. The display device of claim 1, wherein the first semiconductor layer comprises polysilicon, and
the second semiconductor layer and the third semiconductor layer each comprise an oxide semiconductor.

3. The display device of claim 2, wherein the second gate insulating layer is also between the active layer and the gate electrode of the driving transistor.

4. The display device of claim 3, wherein the third gate insulating layer is above the second gate insulating layer.

5. The display device of claim 4, wherein at least a portion of the third gate insulating layer covers the gate electrode of the second switching transistor.

6. The display device of claim 3, wherein the third gate insulating layer is between the second gate insulating layer and the first interlayer insulating layer.

7. The display device of claim 1, wherein the active layer of the second switching transistor is on the third gate insulating layer.

8. The display device of claim 7, further comprising an insulating pattern between the active layer and the gate electrode of the driving transistor, and between the third gate insulating layer and the first interlayer insulating layer.

9. The display device of claim 7, wherein the active layer of the driving transistor and the active layer of the second switching transistor are on the same layer.

10. The display device of claim 7, wherein the active layer of the driving transistor is on the second gate insulating layer.

11. The display device of claim 1, wherein the distance between the active layer and the gate electrode of the second switching transistor is smaller than a distance between the active layer and the gate electrode of the first switching transistor.

12. The display device of claim 11, wherein a thickness of the second gate insulating layer is smaller than a thickness of the first gate insulating layer.

13. The display device of claim 12, wherein the first gate conductive layer further comprises an electrode of a first capacitor on the first gate insulating layer and overlapping the gate electrode of the driving transistor.

14. The display device of claim 12, wherein the first semiconductor layer further comprises a semiconductor pattern on the buffer layer and in a region overlapping the gate electrode of the driving transistor.

15. The display device of claim 1, wherein at least one layer selected from the first semiconductor layer of the first switching transistor and the second semiconductor layer of the second switching transistor does not overlap the third gate insulating layer.

16. A display device comprising:
a substrate;
a driving transistor on the substrate and comprising a first active layer and a first gate electrode;
a first switching transistor comprising a second active layer, the second active layer being disposed on a layer that is different from a layer on which the first active layer is positioned, and a second gate electrode;
a second switching transistor comprising a third active layer, the third active layer being disposed on a layer that is different from the layer on which the second active layer is positioned and the layer on which the first active layer is positioned, and a third gate electrode;
a first gate insulating layer between the second active layer and the second gate electrode;
a second gate insulating layer between the third active layer and the third gate electrode; and
a third gate insulating layer between the first active layer and the first gate electrode,
wherein a first distance between the first active layer and the first gate electrode is greater than a second distance between the second active layer and the second gate electrode,
wherein, in an upward direction from the substrate, the first active layer is above the first gate electrode, and the third gate electrode is at a higher level than the third active layer, and
wherein at least one layer selected from the second active layer of the first switching transistor and the third active layer of the second switching transistor does not overlap the third gate insulating layer in a thickness direction of the display device.

17. The display device of claim 16, wherein the second distance is greater than a third distance between the third active layer and the third gate electrode.

18. The display device of claim 17, wherein the first active layer and the third active layer each comprise an oxide semiconductor, and the second active layer comprises polysilicon.

19. The display device of claim 16, wherein the first gate electrode, the first active layer, the third gate electrode, and the third active layer are each at a higher level than the first gate insulating layer.

20. The display device of claim 19, wherein the second gate insulating layer is also between the first gate electrode and the first active layer.

21. The display device of claim 20, wherein the third gate insulating layer is between the second gate insulating layer and the first active layer.

* * * * *